(12) United States Patent
Wickeraad

(10) Patent No.: US 8,473,832 B2
(45) Date of Patent: Jun. 25, 2013

(54) PARITY ERROR CHECKING AND COMPARE USING SHARED LOGIC CIRCUITRY IN A TERNARY CONTENT ADDRESSABLE MEMORY

(75) Inventor: John Wickeraad, Granite Bay, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 790 days.

(21) Appl. No.: 12/543,695

(22) Filed: Aug. 19, 2009

(65) Prior Publication Data

US 2009/0307569 A1 Dec. 10, 2009

Related U.S. Application Data

(62) Division of application No. 11/213,367, filed on Aug. 26, 2005, now Pat. No. 7,594,158.

(51) Int. Cl.
*G06F 11/00* (2006.01)

(52) U.S. Cl.
USPC .......................................................... 714/801

(58) Field of Classification Search
USPC .......................................................... 714/801
See application file for complete search history.

(56) References Cited

U.S. PATENT DOCUMENTS

| | | |
|---|---|---|
| 5,491,703 A | 2/1996 | Barnaby et al. |
| 5,890,221 A | 3/1999 | Liu et al. |
| 6,067,656 A | 5/2000 | Rusu et al. |
| 6,597,595 B1 | 7/2003 | Ichiriu et al. |
| 6,690,595 B1 | 2/2004 | Srinivasan et al. |
| 6,700,810 B1 | 3/2004 | Ichiriu et al. |
| 6,707,693 B1 | 3/2004 | Ichiriu |
| 6,728,124 B1 | 4/2004 | Ichiriu et al. |
| 6,760,881 B2 * | 7/2004 | Batson et al. .................. 714/773 |
| 6,914,795 B1 | 7/2005 | Srinivasan et al. |
| 6,987,684 B1 | 1/2006 | Branth et al. |
| 7,002,823 B1 | 2/2006 | Ichiriu |
| 7,043,673 B1 | 5/2006 | Ichiriu et al. |
| 7,133,302 B1 | 11/2006 | Srinivasan et al. |
| 7,216,284 B2 | 5/2007 | Hsu et al. |
| 7,237,156 B1 | 6/2007 | Srinivasan et al. |
| 7,243,290 B2 | 7/2007 | Slavin |
| 7,254,748 B1 | 8/2007 | Wright et al. |
| 7,257,763 B1 | 8/2007 | Srinivasan et al. |
| 7,283,380 B1 | 10/2007 | Srinivasan et al. |
| 2004/0260868 A1 * | 12/2004 | Sit et al. ........................ 711/108 |
| 2007/0061692 A1 | 3/2007 | Wickeraad |

* cited by examiner

*Primary Examiner* — Scott Baderman
*Assistant Examiner* — Jigar Patel

(57) ABSTRACT

Methods and apparatus for performing, using smaller, more efficient shared logic circuitry, the parity checking function and the compare function in a mutually exclusive manner in different cycles of a ternary content addressable memory are disclosed.

22 Claims, 16 Drawing Sheets

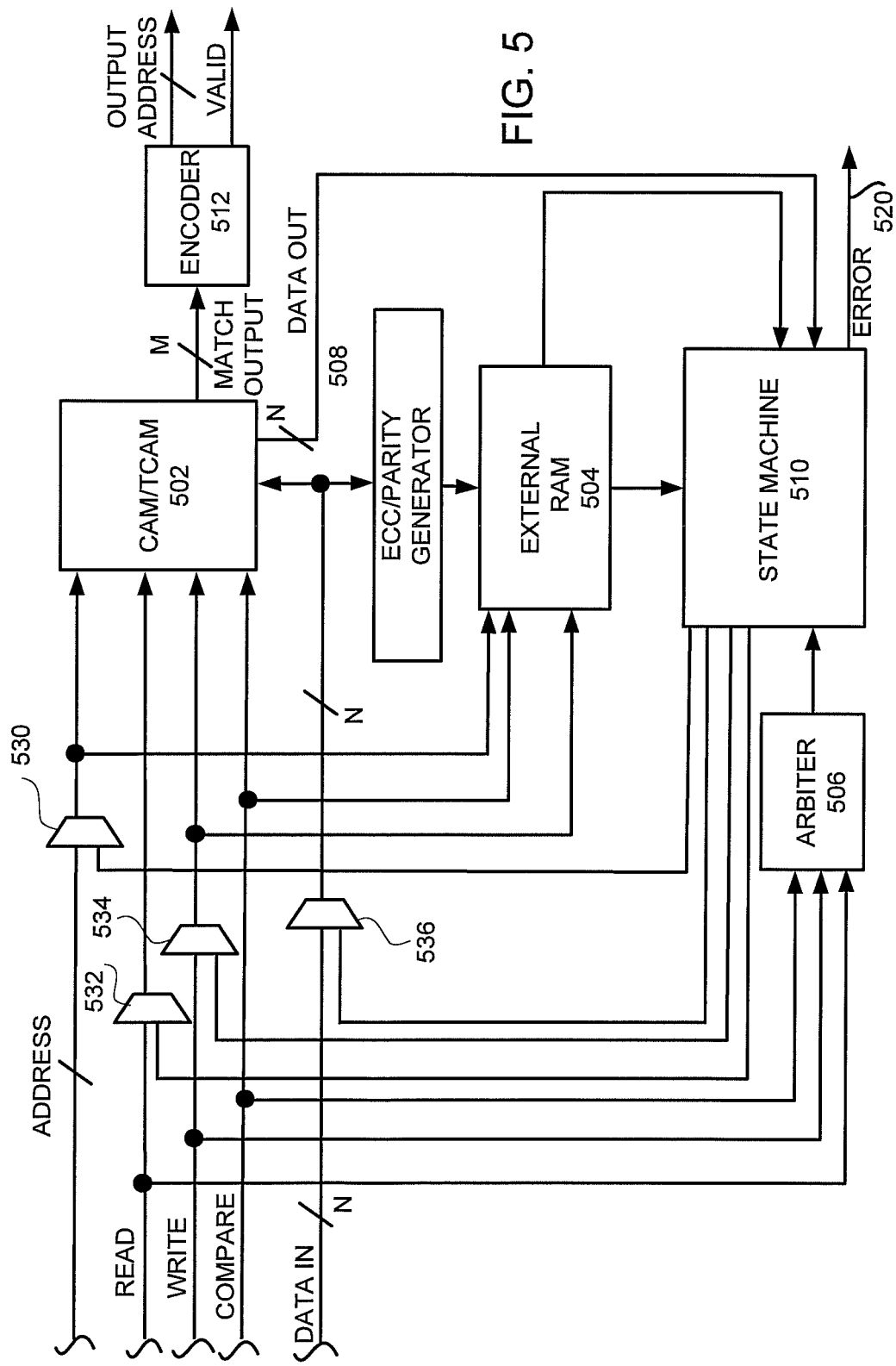

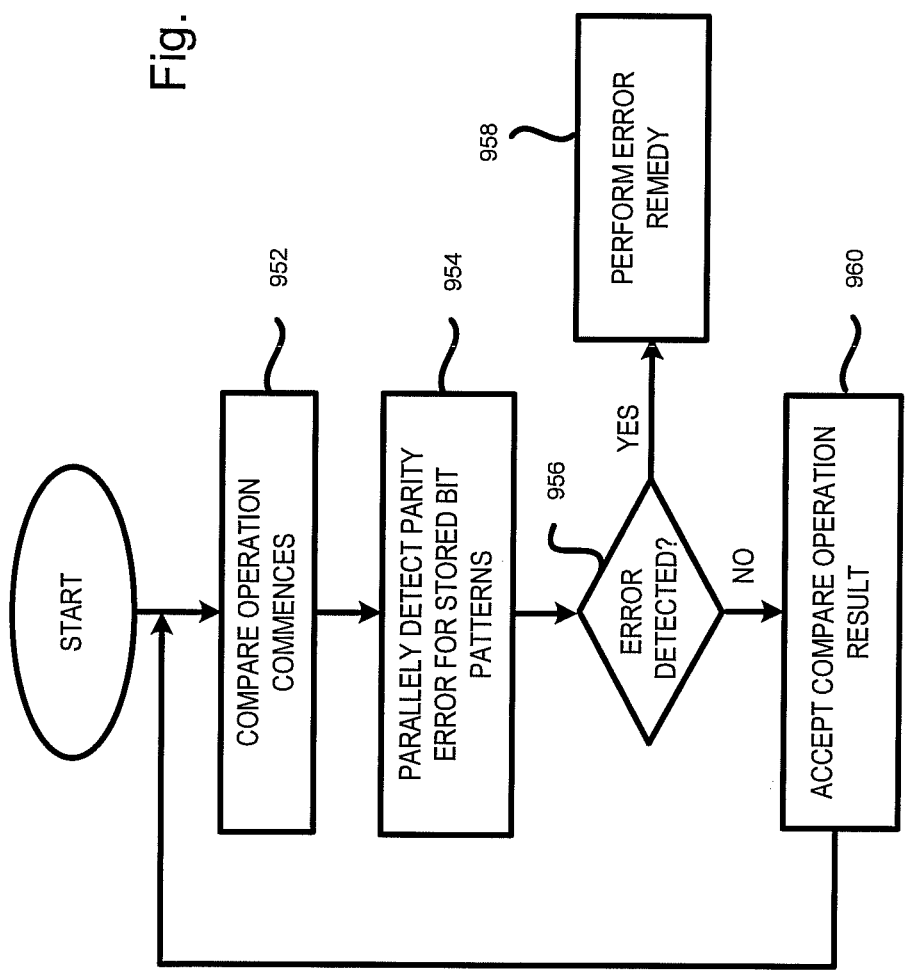

PARITY ERROR CHECKING AND COMPARE USING SHARED LOGIC CIRCUITRY IN A TERNARY CONTENT ADDRESSABLE MEMORY

The present application is a divisional of U.S. patent application Ser. No. 11/213,367, filed Aug. 26, 2005, now U.S. Pat. No. 7,594,158 which is incorporated by reference in its entirety.

BACKGROUND OF THE INVENTION

Content-Addressable Memories (CAMs) and Ternary Content-Addressable Memories (TCAMs) have been in use for some time. CAMs and TCAMs are routinely employed in various applications including, for example, lookup tables for IP (Internet Protocol) routers.

To facilitate discussion of CAMs and TCAMs, FIG. 1 shows a portion of an example prior art CAM 100 that is configured to decode an input pattern of 3 bits to a single match result. In a typical real world application, however, the number of bits may vary. Furthermore, CAMs may be implemented using different technologies although the basic functions described below are essentially the same for all CAMs.

In FIG. 1, there are shown three input lines B1, B2, and B3, representing the input lines for the input bits. The bit lines are intersected by a plurality of word compare circuits W1, W2, W3, etc..... Since the example of FIG. 1 involves 3 input bits, there may be $2^3$ or 8 possible word combinations and hence 8 possible word compare circuits W1-W8. In other implementations, there may be a greater or fewer number of word compare circuits than $2^n$ (where n=number of input bits).

Each word compare circuit includes a plurality of bit compare circuits, with each bit compare circuit being associated with one of input bit lines B1-B3. Thus, in word compare circuit W1, there are three bit compare circuits 110, 112, and 114 corresponding to respective input bits B1, B2, and B3. Each of bit compare circuits 110, 112, and 114 includes a compare value storage cell and cell compare circuitry. For example, bit compare circuit 110 includes a compare value storage cell D1 and cell compare circuitry 122.

A compare value storage cell, such as compare value storage cell D1, is used to store one bit of data against which the corresponding input bit is compared. The comparison is performed by the associated cell comparison circuitry (so that cell comparison circuitry 122 would be employed to compare input bit B1 against the data value stored in compare value storage cell D1, for example).

In a typical implementation, the compare value storage cells of CAMs (such as compare value storage cell D1) is implemented using SRAM (Static Random Access Memory) technology. SRAM technology is typically employed due to the high density offered. Generally speaking, TCAMs also employ SRAM technology for their compare value storage cells and mask value storage cells for the same reason. The bit compare circuit may be implemented using a combination of an XNOR gate and an AND gate connected as shown in cell compare circuitry 122. The inputs for each AND gate (such as AND gate 130 of cell compare circuit 112) are taken from the output of the associated XNOR gate (such as XNOR gate 132) and the output of the previous bit compare circuit (such as bit compare circuit 110). If there is no output from the previous bit compare circuit, a value "1" is used (as can be seen with AND gate 140).

Suppose that the three compare value storage cells associated with word compare circuit W1 store the bit pattern "101". This bit pattern "101" is compared against the bit pattern inputted into bit lines B1-B3. If the input bit pattern presented on bit lines B1-B3 is also "101", the comparison result against the data values stored in word compare circuit W1 would be a match, and the output 160 of word compare circuit W1 would be active. Any word compare circuit whose stored bit pattern is different from "101" would have an inactive output. On the other hand, if the input bit pattern presented on bit lines B1-B3 is "111", the comparison result against the data values stored in word compare circuit W1 would not be a match, and the output 160 of word compare circuit W1 would be inactive. The word compare circuit whose stored bit pattern is "111" would have an active output.

As can be seen, CAM 100 returns at most a single match ($W_1 \ldots W_N$) for a given input bit pattern (assuming that a unique input bit pattern is loaded or stored in each word compare circuit). The match ($W1 \ldots W_N$) may then be encoded to an address of the matched word.

TCAMs are similarly constructed as seen in FIG. 2. A TCAM offers the ability to mask certain input bits per entry, turning these input bits into "don't care" bits. For example, whereas the input bit pattern "011" would yield a single match using a CAM, it is possible to specify that the first bit "0" is a "don't care" for a specific entry. In this case, the first bit is said to be "masked" during the comparison process, and the result matches against either stored bit pattern "111" or "011". For TCAMs, it is common for multiple entries to match, and the first match is typically selected and the address of the first match encoded.

The difference between FIG. 2 (TCAM) and FIG. 1 (CAM) is the presence of the mask bit storage cells M1, M2, and M3, and the extra OR gates 202, 204, and 206. Each OR gate is inserted between the output of the XNOR gate and the input of the AND gate in each bit compare circuit. For example, OR gate 204 has two inputs: the output of XNOR gate 132 and the value of the mask bit in mask bit storage cell M1. It should be apparent to one skilled in the art that when the mask bit is "0", the associated TCAM bit storage circuit functions in the same manner as the CAM bit storage circuit of FIG. 1. When the mask bit is "1", the associated TCAM bit storage circuit implements the "don't care" function.

As mentioned, both CAMs and TCAMs are implemented using SRAM technology. SRAM technology, as is known, suffers from soft errors, which is attributed to the presence of naturally occurring alpha particles. SRAM memory chips, which are employed to store data for use by computer applications and/or the operating system, may employ error correcting code (ECC) or parity bits for the stored words. For example, a parity bit may be stored for each data word written into the SRAM memory chip. Parity checking may be performed after reading the stored data word from the SRAM memory to ensure data integrity. By checking for parity, a soft error on one of the stored bits can be detected before a stored data word is utilized.

With CAMs and TCAMs, error detection is more difficult since the corruption of one or more bits may still yield a match output, albeit the wrong match output. For example, if a stored bit pattern "101" is corrupted and becomes "001" due to a soft error on the most significant bit, inputting a bit pattern of "001" may yield a match output, albeit a match output that is due to soft error. The input bit pattern "101" may yield a "no match" result, which is also a legitimate output for CAMs and TCAMs. Thus, unlike SRAM memory chips, the outputs of CAMs and TCAMs (which reflect a match or no match) do not lend themselves to parity checking easily. This is because the output of a CAM/TCAM is either a no-match or a match (which is then decoded into an output address) instead of the stored bits themselves (as in the case with SRAMs). Accordingly, performing parity/ECC on the CAM/TCAM output would not reveal the data corruption that occurs to the stored bit pattern inside the CAM/TCAM. This is in contrast to the case with SRAM, whereby the output is the read stored bit pattern itself and parity/ECC can be applied to the stored bit pattern read from memory prior to use.

Data corruption is also exacerbated as the device geometries shrink. As devices become smaller, the compare value storage cells and/or the mask bit storage cells become more susceptible to data corruption. Additionally, as CAMs and TCAMs become denser and include a larger number of storage cells, the probability of corruption to one of the stored compare value bits or stored mask bits increases. Furthermore, as manufacturers pack more devices into smaller form factors, devices are being placed near and/or under area bumps (i.e., the connection points to connect the chip to the outside world). It has been found that storage cells near and/or under the area bumps tend to suffer a higher rate of soft errors.

Because of the increased likelihood of soft errors, manufacturers have become concerned over CAM and TCAM reliability. To the inventor's knowledge, the solution thus far has been to periodically reload the CAMs and TCAMs with fresh compare values and/or fresh mask bit values. However, this approach is inefficient since the CAMs/TCAMs are essentially unusable during the loading process. Furthermore, from the time the soft error occurred until the CAM/TCAM is reloaded, incorrect results may occur.

In view of the foregoing, improved solutions for managing soft errors in CAMs/TCAMs are needed.

SUMMARY OF THE INVENTION

The invention relates, in an embodiment, to a method for remedying data corruption in a ternary content addressable memory (TCAM) integrated circuit (IC). The TCAM IC has a plurality of word compare circuits, each of the plurality of word compare circuits being configurable to perform either a compare function or a parity checking function during a given cycle of the TCAM IC. The method includes selecting the TCAM IC to perform either the compare function or the parity checking function, the compare function and the parity checking function being performed by mutually exclusively shared dual function logic circuitry in the each of the plurality of word compare circuits that performs the compare function and the parity checking function in the alternative in any given cycle of the TCAM IC. The method includes processing outputs of the word compare circuits as TCAM match results if the TCAM IC is selected to perform the compare function. The method further includes processing outputs of the word compare circuits as parity error signals if the TCAM IC is selected to perform the parity checking function.

In another embodiment, the invention relates to a ternary content addressable memory (TCAM) integrated circuit (IC) that includes a plurality of word compare circuits, each of the plurality of word compare circuits being configurable to perform either a compare function or a parity checking function during a given cycle of the TCAM IC. The TCAM IC further includes mutually exclusively shared dual function logic circuitry in the each of the plurality of word compare circuits that performs the compare function and the parity checking function in the alternative in any given cycle of the TCAM IC, wherein when the TCAM IC is selected to perform the compare function, outputs of the word compare circuits represent TCAM match results and when the TCAM IC is selected to perform the parity checking function, outputs of the word compare circuits represent parity error signals.

In yet another embodiment, the invention relates to a method for remedying data corruption in a ternary content addressable memory (TCAM) integrated circuit (IC), the TCAM IC having a plurality of word compare circuits, each of the plurality of word compare circuits being configurable to perform either a compare function or a parity checking function during a given cycle of the TCAM IC. The method includes providing the TCAM IC having at least mutually exclusively shared dual function logic circuitry in the each of the plurality of word compare circuits, the mutually exclusively shared dual function logic circuitry includes shared logic that is shared in a mutually exclusive manner by the compare function and the parity checking function so as to render the dual function logic circuitry incapable of performing both the compare function and the parity checking function in any one cycle of the TCAM IC. The method further includes selecting the TCAM IC to enable the TCAM IC to perform either the compare function or the parity checking function. The method additionally includes processing outputs of the word compare circuits as TCAM match results if the TCAM IC is selected to perform the compare function. The method also includes processing outputs of the word compare circuits as parity error signals if the TCAM IC is selected to perform the parity checking function.

In various embodiments, the same conductor line from bit line stage to bit line stage in each word compare circuit is employed to alternately convey the compare result information or the parity-related information, depending on the mode of operation of the TCAM. This sharing of the conductor line improves the efficiency of the resultant TCAM. Further, the same encoder is shared, in various embodiments, by the plurality of word compare circuits to identify the identity of the word compare circuit that outputs the first match (if the compare function is enabled) or to identify the word compare circuit that produces the first parity error (if the parity checking function is enabled and such an error exists). The sharing of the encoder further improves the efficiency of the resultant TCAM.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

FIG. 5 shows, in accordance with an embodiment of the invention, a more complete example implementation of an arrangement for remedying data corruption in a CAM/TCAM.

FIG. 9B shows, in accordance with an embodiment of the an embodiment of the present invention, a flowchart for parallel parity checking for data corruption in a CAM/TCAM.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention. The features and advantages of the present invention may be better understood with reference to the drawings and discussions that follow.

Figure 3:
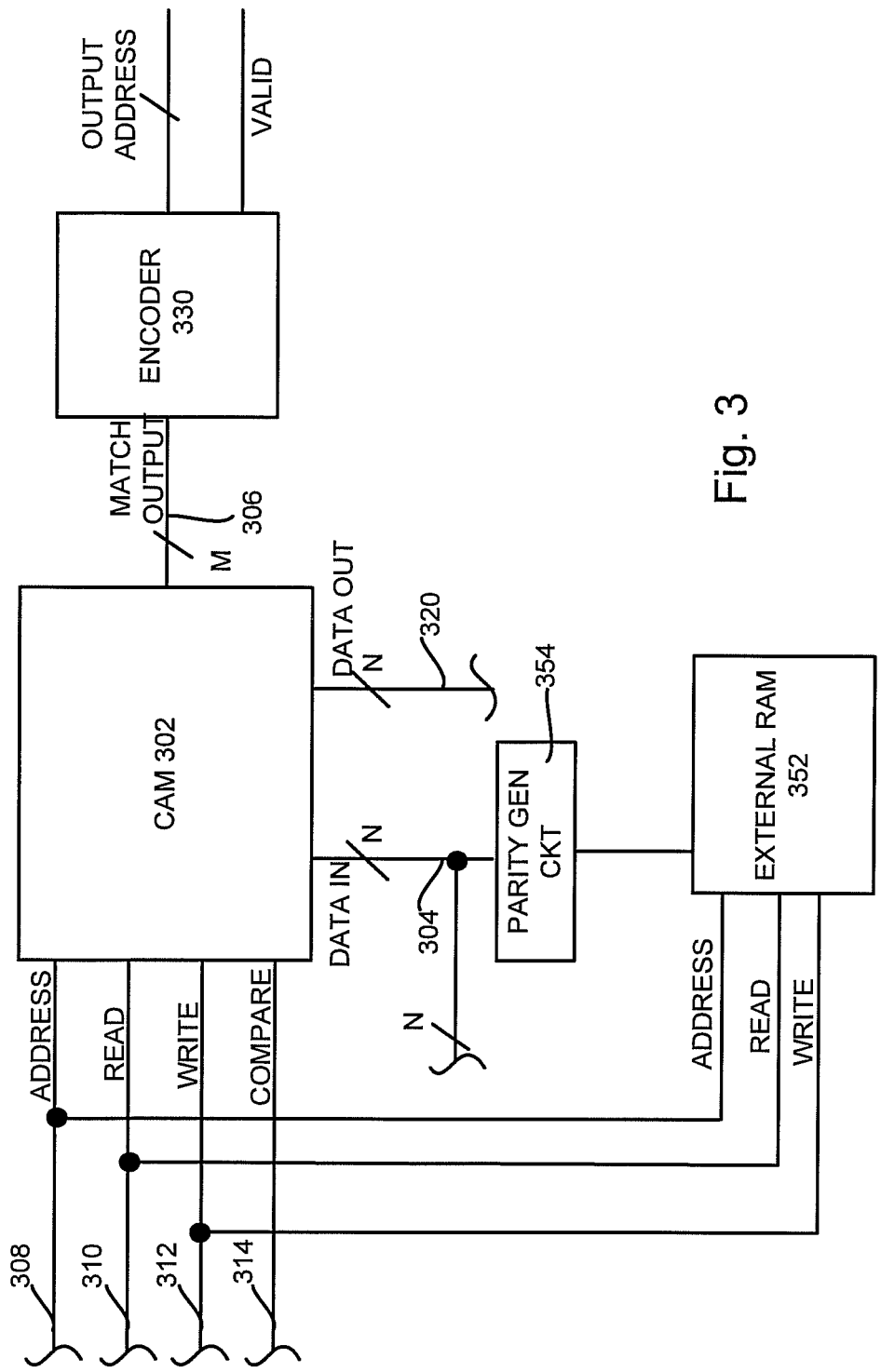
FIG. 3 shows, in accordance with an embodiment of the present invention, a parity-checking CAM arrangement for remedying storage bit corruption.

FIG. 3 shows, in accordance with an embodiment of the present invention, a parity-checking CAM arrangement for remedying storage bit corruption. For easy understanding, the examples herein focus primarily on CAMs. It should be understood, however, that embodiments of the invention also apply to TCAMs. Some details pertaining to TCAM adaptation will be discussed. However, it is assumed that one skilled in the art can apply conventional knowledge to adapt the discussion to TCAMs if certain details are not explicitly mentioned.

Referring back to FIG. 3, there is shown a CAM block 302, representing the circuitry that implements the above-discussed CAM function. CAM block 302 is typically a circuit provided by a CAM manufacturer who specializes in manufacturing CAMs. CAM block 302 includes a data bus 304 having N bits, and a set of CAM outputs 306 comprising M outputs. In many cases, CAM block 302 represents circuitry that cannot be easily modified and thus error detection/correction is implemented using a circuit that is external to the circuit that implements CAM block 302.

There is also an address bus 308 having an adequate number of bits to cover all the M word compare circuits within CAM block 302. In the case of CAM, for example, if there are 8 word compare circuits, the address bus may contain 3 bits (since 2^3 covers all 8 word compare circuits). If FIG. 3 reflects a TCAM instead, address bus 308 may include an extra address bit to specify whether the data being accessed (for reading or writing) pertains to the compare values or the mask bits. Alternatively, the TCAM may employ a separate signal to specify whether the data being accessed (for reading or writing) pertains to the compare values or the mask bits.

Read signal 310 represents the signal employed to read a bit pattern from a particular address specified by address bus 308, which bit pattern may represent either the stored compare values or the stored mask bits (for TCAMs) as specified. The read bit pattern are output on an output data bus 320.

Write signal 312 represents the signal employed to write a bit pattern presented on input data bus 304 to a particular address specified by address bus 308. The bit pattern written may represent either the stored compare values or the stored mask bits as specified. Similarly, compare signal 314 represents the signal employed to compare a bit pattern presented on input data bus 304 against the stored bit patterns within the CAM. For a TCAM the stored mask data is used during the compare operation to select what bits to compare for that entry.

Output bus 306 is encoded into an address and a valid signal by encoder 330. The address is then utilized by other circuitry in order to, for example, route IP packets. The valid signal indicates that there is a valid match. If no valid signal is asserted, no match is found for the input bit pattern. For TCAMs, encoder 330 additionally includes circuitry to select the first match from the (possible) plurality of matches (which are the result of don't care bits).

Since CAM block 302 is typically provided by a CAM manufacturer, it is often not possible to modify the circuitry within CAM block 302 to implement parity checking and/or ECC if such capability is not provided. In accordance with an embodiment of the present invention, an external RAM may be employed to provide the parity and/or ECC function for the data stored in CAM block 302.

For example, an external RAM 352 is coupled to a parity generator circuit 354, which generates a parity value from the data present at input data bus 304. Each time a pattern is written into CAM block 302, a computed parity value is written into external RAM 352 at the address specified by address bus 308. Thus each stored bit pattern in CAM 302 has a corresponding parity value in external RAM 352.

In the case of a CAM having M word compare circuits, the depth of external RAM 352 is M (i.e., there are M parity bits stored in external RAM 352). In the case of a TCAM having M word compare circuits, the depth of external RAM 352 is M*2 since there are M parity bits for the stored compare values and M parity bits for the stored mask values. In the case of a TCAM having M word compare circuits and N bits per word, if ECC is implemented (single bit detection, double bit correction), log 2(N) bits are provided in external RAM 352 per CAM word.

It has been noted by the inventor herein that a typical CAM/TCAM may be idle for some percentage of time. In other words, there are periods of time during operation when no reading, writing, or comparing activities involving the CAM/TCAM occurs. The inventor herein realizes that if this time can be employed to scrub the content of the CAM/TCAM to detect and/or correct the data corruption, the reliability of the CAM/TCAM may be vastly improved with minimal or no time overhead to the overall system performance. However, it should be understood that if data protection is a high priority, scrubbing may also be performed during a non-idle cycle, i.e., a cycle specifically allocated for the scrubbing even though the CAM/TCAM may not have any idle cycle to spare.

Figure 4A:
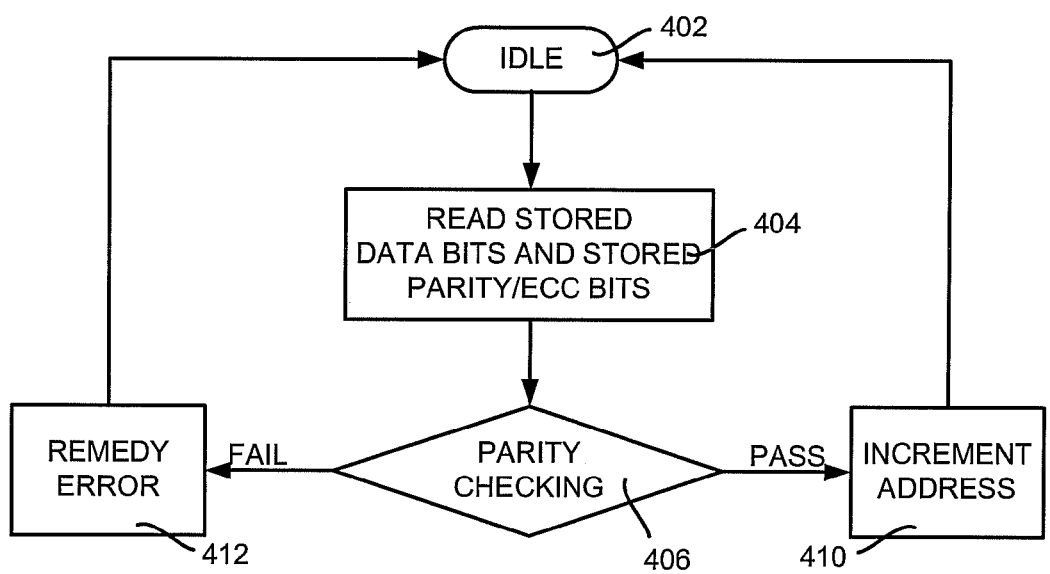
FIG. 4A shows, in accordance with an embodiment of the present invention, a flowchart for implementing scrubbing on the CAM to detect and/or correct the corruption of the stored bit pattern using parity.

FIG. 4A shows, in accordance with an embodiment of the present invention, a flowchart for implementing scrubbing on the CAM to detect and/or correct the corruption of the stored bit pattern using parity. Generally speaking, an arbiter is employed to monitor for inactivity on the CAM. For example, the arbiter circuit may monitor the read, write, and compare signals for inactivity. If no reading/writing/comparing occurs, the CAM is deemed idle or in an idle cycle (402) and scrubbing may commence.

As the term is employed herein, scrubbing refers to sequentially crawling (i.e., reading, checking and correcting if necessary) through the stored bit patterns during one or more cycles of the CAM. Although scrubbing may be performed to advantage during idle cycles, scrubbing may also be performed during non-idle cycles (i.e., during cycles allocated for the scrubbing activity although the CAM or TCAM may not have idle cycles to spare). The cycles during which scrubbing occurs are referred to herein as scrubbing cycles and may represent either idle cycles or non-idle cycles.

To implement scrubbing in the present example, the method sequentially "crawls" through the stored bit patterns stored in CAM 302 and performs parity checking (406) on each stored bit pattern read (404) from CAM 302. In parallel, the parity/ECC information is also read from external memory 352.

In step 406, the result of the parity checking on the stored bit pattern read is either pass or fail. If pass, the address is incremented (410) to allow the next bit pattern to be "scrubbed,", i.e., read from CAM 302 and checked. Note that the next stored bit pattern is not read until there is an idle cycle in the CAM or until scrubbing is deemed necessary (in which case, a non-idle cycle may be allocated for scrubbing). In some cases, a stored bit pattern may be read and checked, and the CAM may proceed with some read/write/compare activity with respect to the data stored in the CAM before the next stored bit pattern may be read and checked. If there is no read/write/compare activity with respect to the data stored in the CAM, stored bit patterns may be read and checked consecutively without interruption.

If fail, the error is remedied in step 412. The remedy may include, for example, interrupting the CPU and reloading the failed bit pattern from an external data store to CAM 302.

Figure 4B:
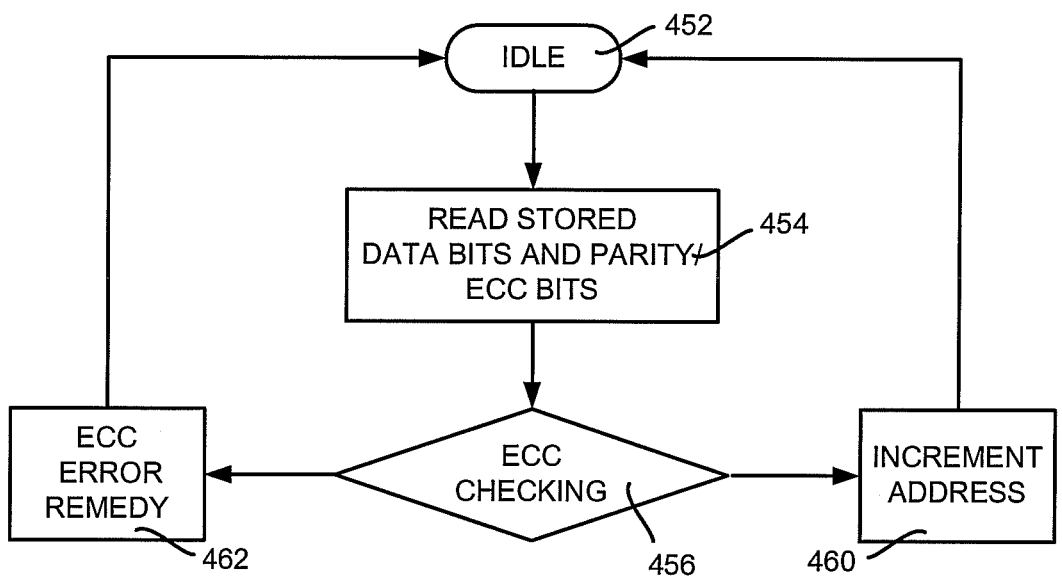
FIG. 4B shows, in accordance with an embodiment of the present invention, a flowchart for implementing scrubbing on the CAM to detect and/or correct the corruption of the stored bit pattern using ECC.

FIG. 4B shows, in accordance with an embodiment of the present invention, a flowchart for implementing scrubbing on the CAM to detect and/or correct the corruption of the stored bit pattern using ECC. Generally speaking, an arbiter is employed to monitor for inactivity on the CAM. For example, the arbiter circuit may monitor the read, write, and compare signals for inactivity. If no reading/writing/comparing occurs, the CAM is deemed idle (452) and scrubbing may commence. As mentioned, scrubbing may also employ a non-idle cycle if scrubbing is deemed a high enough priority activity to justify the use of a non-idle cycle. To implement scrubbing, the method "crawls" through the stored bit patterns stored in CAM 302 and performs checking (456) on each stored bit pattern read (454) from CAM 302.

In step 456, the result of the error checking is either pass or fail. If pass, the address is incremented (460) to allow the next bit pattern to be read from CAM 302 and checked. This step 460 is similar to step 410 in FIG. 4A. If fail, ECC is employed in step 462 to correct the error and to reload the corrected bit pattern to CAM 302 during the next idle cycle, for example. During EEC correction, an interlock mechanism may be employed, in an embodiment to prevent the CPU from writing to the bit pattern being corrected.

With respect to FIGS. 4A and 4B, if a TCAM is involved instead of a CAM, the bit pattern read/checked/corrected may pertain to either the compare value stored bits or the mask value stored bits. Whether the compare value stored bits or the mask value stored bits are read/checked/corrected may depend on the address specified (if an extra address bit is employed to distinguish between stored compare values and stored mask values) or on the state of the extra signal employed to distinguish between stored compare values and stored mask values. In an embodiment, parity/ECC check may be performed on the combined compare value stored bits and the mask value stored bits. In this embodiment, both words may be read and a single parity/ECC check may be performed on both words.

FIG. 5 shows, in accordance with an embodiment of the invention, a more complete example implementation of an arrangement for remedying data corruption in CAM/TCAM 502, including the external RAM 504, and an arbiter circuit 506 which monitors for inactivity on the CAM/TCAM, and ECC/parity generator circuit 508. FIG. 5 also includes a state machine 510, representing a circuit that implements the method described in connection with FIG. 4A or FIG. 4B. There is also shown an encoder circuit 512, the function of which has been described earlier in connection with FIG. 3.

Generally speaking, state machine 510 is granted the lowest priority by arbiter 506 such that scrubbing occurs when there are no reading/writing/comparing activities on the CAM/TCAM 502. During scrubbing, state machine 510 crawls through the content of CAM/TCAM 502 to scrub errors. State machine 510 may sequentially read stored data patterns from CAM/TCAM 502 and corresponding parity/ECC information from external RAM 504 to generate an error signal 520 if an error is detected. Multiplexers 530 and 532 facilitate reading from the CAM/TCAM 502 and external RAM 504. Error signal 520 may be employed to initiate error remedy as discussed. If ECC correction is performed by state machine 510, for example, multiplexers 530, 534, and 536 facilitate writing the corrected bit pattern (and computed parity/ECC information) to CAM/TCAM 502 and external RAM 504 respectively. Multiplexer 536 may be employed during ECC and is controlled by state machine 510.

Although the embodiments discussed in connection with FIGS. 3-5 offer the ability to detect and/or correct errors in CAMs/TCAMs when the CAM block or the TCAM block cannot be easily modified, it is possible that an error may exist with respect to one of the stored bit patterns for some period of time before the error can be discovered by the crawling/scrubbing mechanism. Before such an error is discovered, the error may cause the CAM or TCAM to provide erroneous comparison results.

In alternative embodiments, the invention provides for arrangements and methods to facilitate more rapid detection of data corruption in a CAM or TCAM. In an embodiment, error checking is provided on all the stored bit patterns (i.e., all the stored data bit patterns in the case of CAMs or all the stored data and mask bit patterns in the case of TCAMs) every time a comparison is made. The error checking is performed substantially contemporaneously with the comparison operation. If an error is detected with respect to any of the stored bit patterns, the comparison result may be discarded and action may be taken to remedy the error.

In an embodiment, each of the stored bit patterns in a CAM is provided with an additional parity bit so as to enable the combined stored bit pattern (comprising the original stored bit pattern and the additional parity bit) to have an odd number of 1's. Error detection may then be performed on the entire combined stored bit pattern to detect if one of the stored bits has flipped, causing the combined stored bit pattern to have an even number of 1's.

In an embodiment, the stored bits of a particular combined stored bit pattern may be XOR-ed together to yield an error detection signal. The error detection signal would have a value of 1 if there is an odd number of 1's in the combined stored bit pattern; otherwise the error detection signal would have a value of zero if there is an even number of 1's (as would be the case if one of the stored bits of the combined stored bit pattern is corrupted). In this example, if the error detection signal is zero, there is an error with the stored bit pattern.

The error detection signals for individual word compare circuits may be ANDed together to yield a global error detection signal. In this example, the global error detection signal for all the all the word compare circuits would have a value of 1 if no errors are detected in any of the combined stored bit patterns. If at least one of the error detection signals has the value of zero (indicating an error with its respective combined stored bit pattern), the global error detection signal would have a value of zero.

Note that the odd/even designations and/or the 1/0 designations are arbitrary. In other words, the additional parity bit may be used to ensure that the combined stored bit pattern has an even number of 1's. In this example, the error detection signal for the combined stored bit pattern would be 0 if there is no data corruption. Otherwise, the error detection signal for the combined stored bit pattern would have a value of 1 if one of the stored bits is corrupted. To complete this example, the global error detection signal would be generated by ORing all the individual error detection signals, and a value of 0 for the global error detection signal indicates that there is no data corruption in any of the stored bit patterns. If the global error detection signal is a "1", a data corruption error has occurred with respect to one of the stored bit patterns.

Note also that the detection function may be performed by an XORing or XNORing. For TCAMs, an additional parity bit may be provided for the stored mask bits of a word compare circuit (of which there are many in a TCAM). Both the stored data bit pattern and the stored mask bit pattern of a given word compare circuit may be watched by an appropriate circuit (such as by XORing), resulting in a single error detection signal for both the stored data bit patterns and the stored mask bit patterns of the TCAM.

Figure 6:
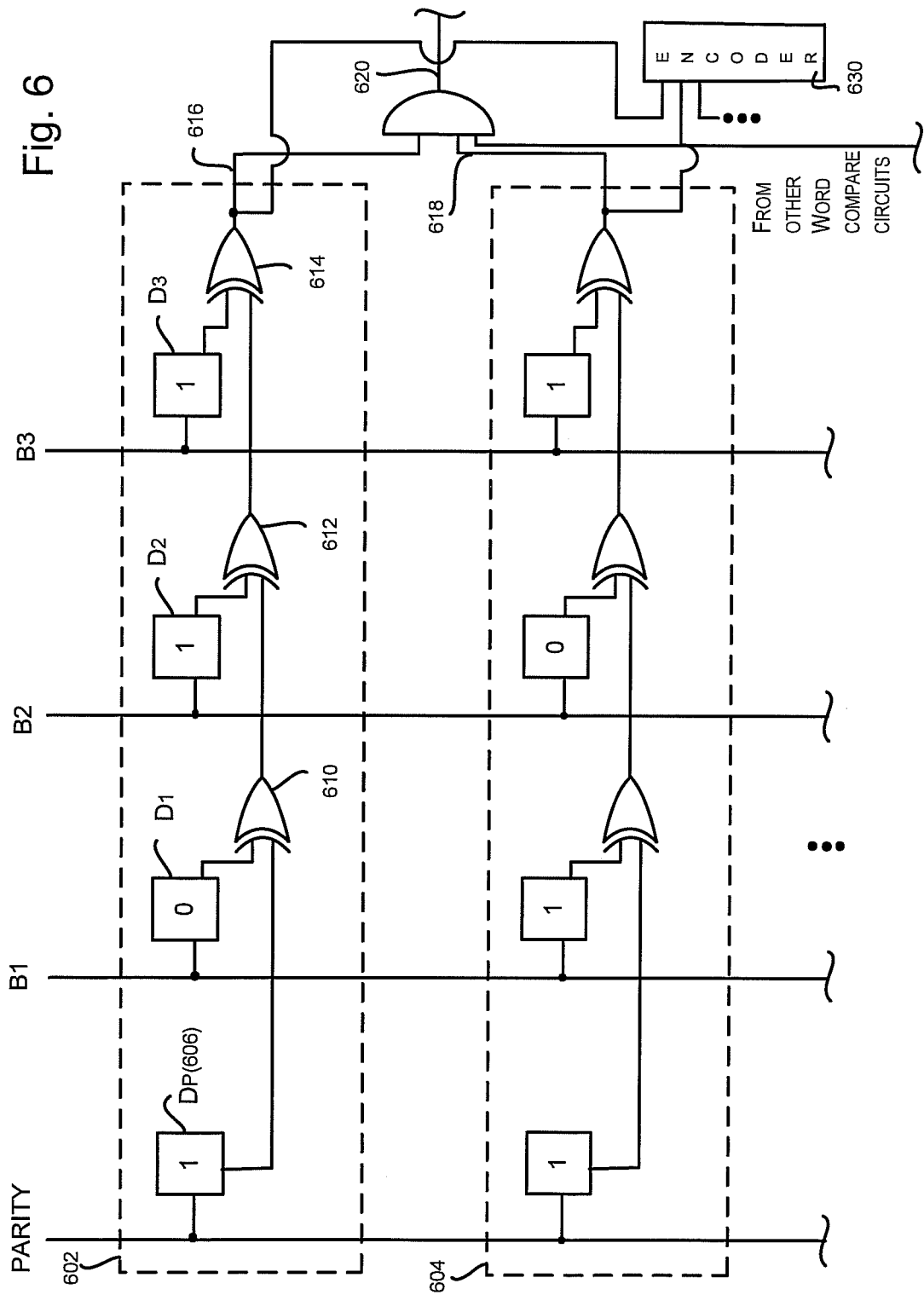
FIG. 6 shows, in accordance with an embodiment, a simplified block diagram view of the arrangement that facilitates substantially contemporaneous detection of data corruption in a CAM while performing a compare operation.

The features and advantages of these alternate embodiments may be better understood with reference to the figures below and the associated discussion. FIG. 6 shows, in accordance with an embodiment, a simplified block diagram view of the arrangement that facilitates substantially contemporaneous detection of data corruption in a CAM while performing a compare operation. The devices for performing the actual compare has been omitted to simplify the illustration. These devices may be found in earlier drawings herein.

In FIG. 6, two example word compare circuits 602 and 604 are shown. For each word compare circuit, compare value storage cells D1, D2 and D3 contain the stored data values used in the compare operation. In other words, compare value storage cells D1, D2 and D3 form the stored bit pattern against which data appearing on bit lines B1, B2, and B3 may be compared against.

There is also shown an additional parity bit storage cell Dp for each of the stored bit patterns. Thus, with respect to the stored bit pattern in word compare circuit 602, additional parity bit storage cell 606 is provided. The stored bit in additional parity bit storage cell 606 and compare value storage cells D1, D2, and D3 make up the combined stored bit pattern.

Suppose that the additional parity bit is provided to ensure that the number of 1's in the combined stored bit pattern is odd. With respect to word compare circuit 602, the stored bit pattern is 011 and thus a "1" would be stored into the additional parity bit storage cell 606 to ensure that the combined stored bit pattern has an odd number of 1's.

The output of the storage cells of a word compare circuit (e.g., the additional parity bit 606 and the stored bits D1, D2, and D3) are X-ORed together in a cascading manner (via XOR gates 610, 612, and 614) to form an error detection signal 616. Other word compare circuits of the CAM (e.g., word compare circuit 604) may be similarly constructed.

The error detection signals of different word compare circuits of the CAM (e.g., error detection signals 616 and 618 of word compare circuits 602 and 604) are AND-ed together to form a global error detection signal 620. In this example, global error detection signal 620 has a value of "1" if each of the combined stored bit patterns in the word compare circuits of the CAM has an odd number of 1's. If a stored data bit in word compare circuit 602 had been corrupted and had been flipped, the number of 1's in the combined stored bit pattern would have been even, and the error detection signal for word compare circuit 602 would have the value of zero. The presence of a zero at the input of AND gate 622 causes AND gate 622 to output a zero, signaling an error.

Note that unlike the embodiments discussed in FIGS. 1-5, this implementation allows an error with any of the word compare circuits of the CAM/TCAM, to be detected substantially contemporaneous with a compare. There is no need to wait for the state machine to crawl through the stored bit patterns during idle cycles. Upon detection of an error, the current compare operation may be immediately invalidated and the error may be remedied.

In an embodiment, the error may be remedied by reloading and/or by performing error correction on all the stored bit patterns of the CAM/TCAM. In another embodiment, the error may be remedied by reloading and/or by performing error correction on only the stored bit pattern associated the word compare circuit from which an error detection signal indicates an error. For example, an optional encoder 630 may be coupled to all error detection signals 616, 618, etc. to provide the address of the first error with which to reload and/or perform error correction on the stored bit pattern within word compare circuit 602. If there are multiple errors on multiple stored bit patterns, the errors may be detected and remedied one-by-one until all errors in the word compare circuits are remedied.

In the case of a TCAM, each of the stored mask bit patterns and stored data bit patterns may have its own additional parity bit. In an embodiment, a first error detection signal is generated for the stored mask bit pattern by XOR-ing the mask bits and the additional parity bit for the stored mask bit pattern. A second error detection signal is generated for the stored data bit pattern by XOR-ing the stored data bits and the additional parity bit for the stored data bit pattern. The first error detection signal and the second error detection signal may then be AND-ed to generate a single error detection signal for both the mask bit pattern and the stored data bit pattern. This embodiment is shown in FIG. 7 wherein the first error detection signal 702 for the stored data bit pattern is combined via AND gate 704 with the second error detection signal 706 to generate a single error detection signal 708 for word compare circuit 710.

Figure 7:
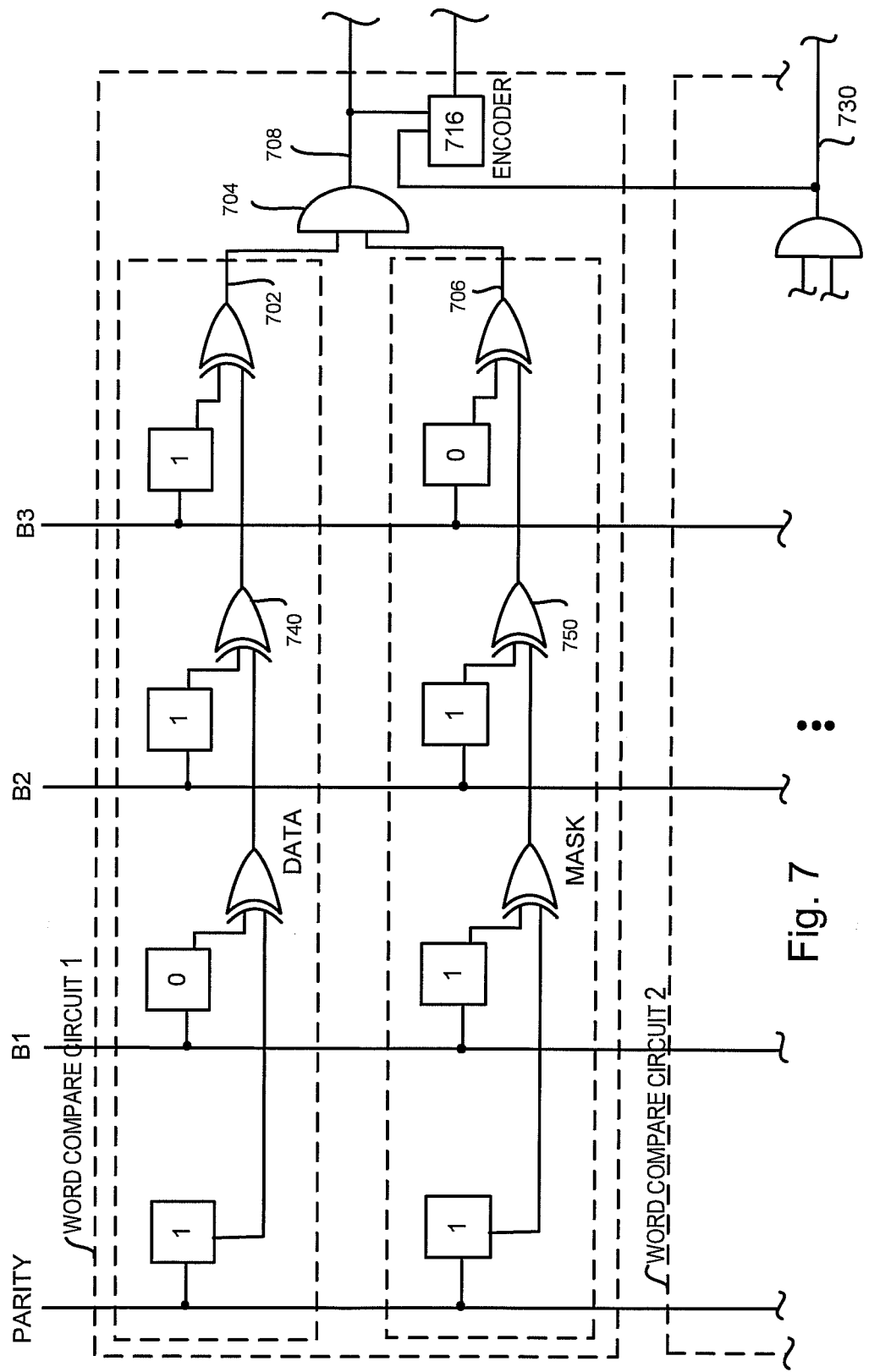
FIG. 7 illustrates, in accordance with an embodiment of the invention, the case wherein each of the stored mask bit pattern and the stored data bit pattern of a given word compare circuit have their own respective additional parity bits.

An encoder 716 may be employed with an error detection signal 708 of word compare circuit 1 and an error detection signal 730 of word compare circuit 2 (and error detection signals of other word compare circuits that are not shown in FIG. 7) to inform the CPU of the identity of word compare circuit associated with the first error in order to allow the CPU correct and/or reload the bit patterns therein. Note that this encoder may not be necessary if error remedy involves reloading and/or performing error correction on all the stored data and/or mask bits.

Figure 8:
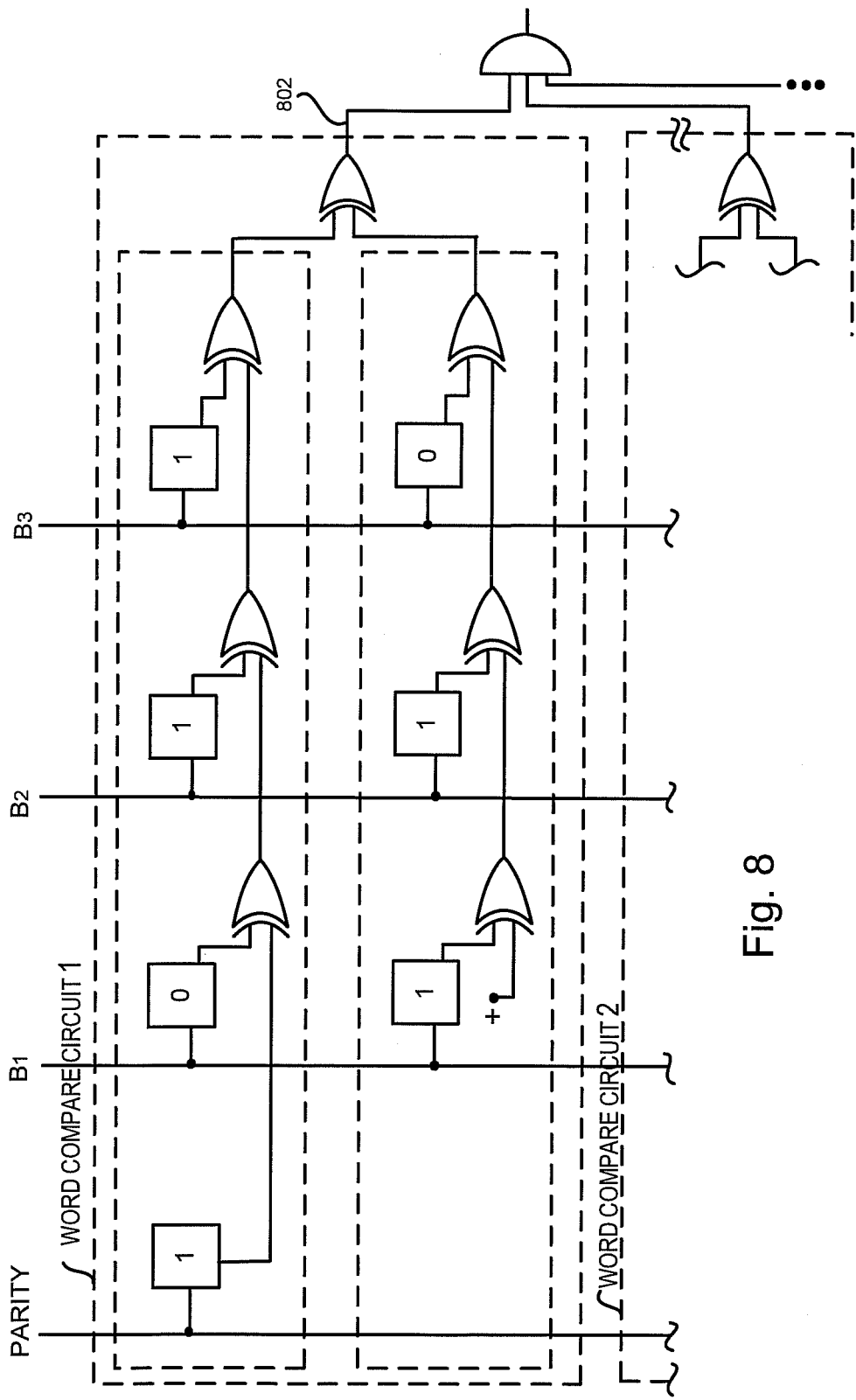
FIG. 8 illustrates, in accordance with an embodiment of the invention, the case wherein a single additional parity bit is provided for the stored mask bit pattern and the stored data bit pattern of a given word compare circuit.

In another embodiment, the additional parity bit for the stored data bit pattern and for the stored mask bit pattern are provided with data to allow the total number of 1's for the combined bit pattern that includes the original stored data bit pattern, the original stored mask bit pattern and the additional parity bit to have an odd number of 1's. Parity detection may be made on this combined bit pattern. FIG. 8 shows such an implementation wherein the error detection signal 802 is activated if the total number of 1's in the stored data bit pattern, the stored mask bit pattern, and the extra parity bit is other than odd. The single additional parity bit may be coupled to either storage cells for the stored data bit pattern or the stored mask bit pattern.

In an embodiment, the value of the additional parity bit associated with the stored data bit pattern ensures that the total number of 1's in the combined stored data bit pattern is even. The value of the additional parity bit associated with the stored mask bit pattern ensures that the total number of 1's in the combined stored data bit pattern is odd. Taken together, the number of 1's in the combination of both the combined stored data bit pattern and the combined stored mask bit pattern is odd when there is no data corruption. Note that one may also implement such error detection capability by using the additional parity bit to ensure that the total number of 1's in the combined stored data bit pattern is even. The additional parity bit associated with the stored mask bit pattern ensures that the total number of 1's in the combined stored mask bit pattern is odd. In this manner, the total number of 1's for the word compare circuit is 1 if there is no error, and conversely, zero if there is an error.

Figure 9A:
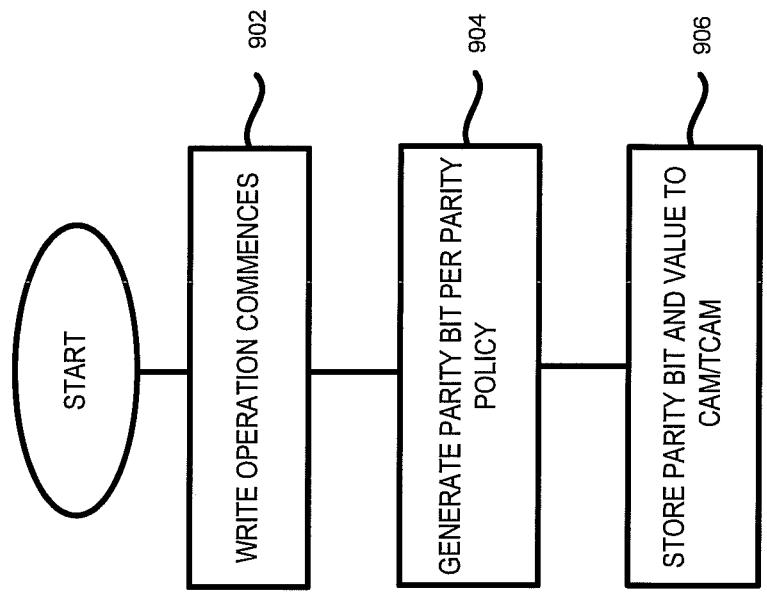
FIG. 9A shows, in accordance with an embodiment of the present invention, a flowchart for writing the additional parity bit in order to facilitate parallel parity checking for data corruption in a CAM/TCAM.

FIG. 9A shows, in accordance with an embodiment of the present invention, a flowchart for writing the additional parity bit in order to facilitate parallel parity checking for data corruption in a CAM/TCAM. In step 902, the write operation (for the stored data bit pattern and/or the stored mask bit pattern) commences. In step 904, the additional parity bit value is generated for the stored bit pattern associated with the current write operation in order to comply with a given parity checking policy (i.e., either odd parity or even parity). In step 906, the additional parity bit value and the stored bit pattern values are stored in the CAM/TCAM.

FIG. 9B shows, in accordance with an embodiment of the an embodiment of the present invention, a flowchart for parallel parity checking for data corruption in a CAM/TCAM. In step 952, the compare operation (using the input data against the stored data bit pattern and/or the stored mask bit pattern) commences. In step 954, data corruption detection is performed using the error detection signals generated for the word compare circuits of the CAM/TCAM. If an error is detected (956), error remedy is performed (958). On the other hand, if an error is not detected, the result of the compare operation is accepted for use (960).

As can be appreciated from the foregoing, embodiments of the invention associated with FIGS. 6-8 ensure that data corruption error can be rapidly detected in every compare cycle. Since parity checks are performed in parallel for all stored bit patterns, the corruption of any of the stored bit patterns, even one not involved in the ongoing compare operation, may be readily detected. Further, since the parity checks are performed in parallel with the compare operation, no additional time delay is required.

Figure 1:
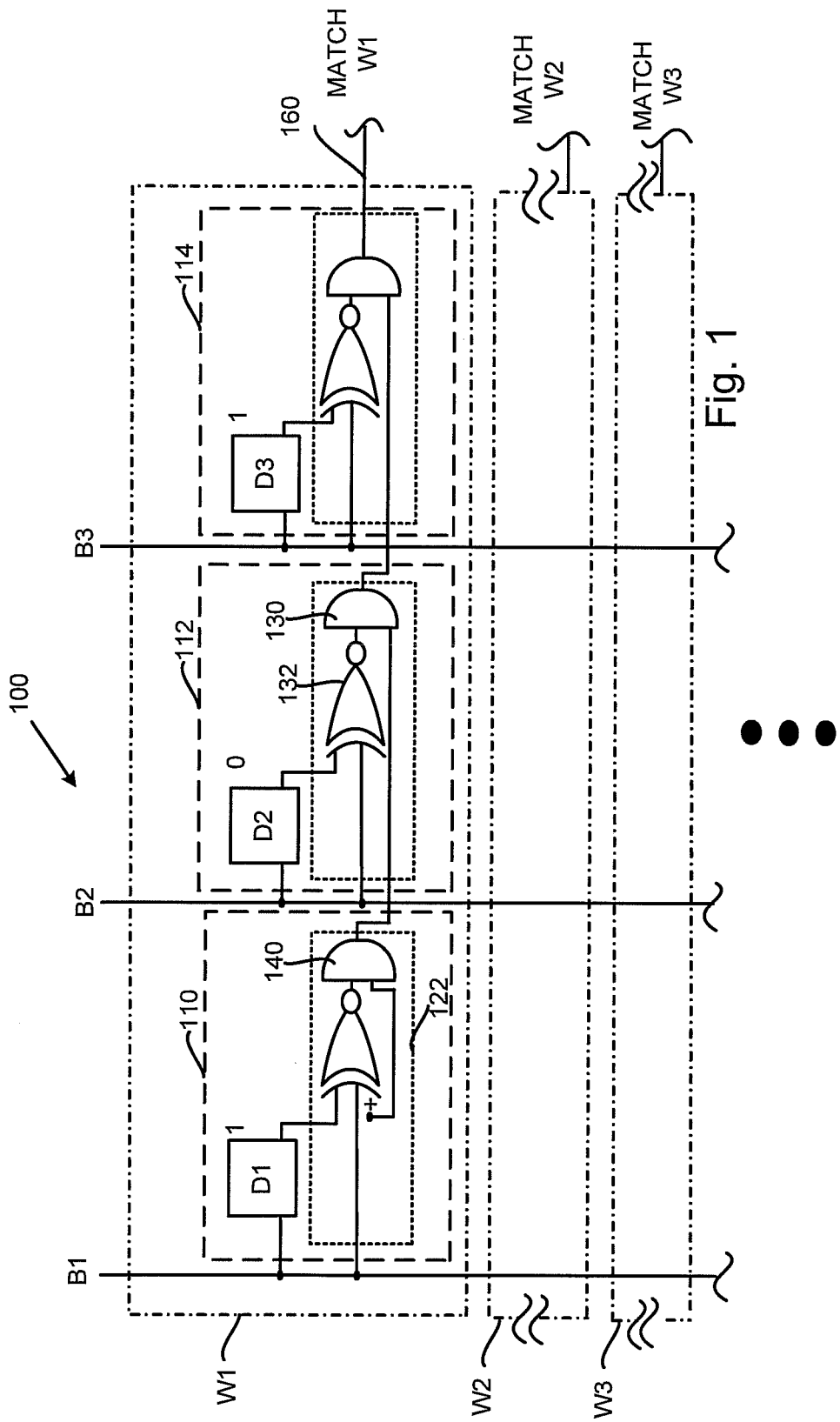
FIG. 1 shows a portion of an example prior art CAM.
Figure 2:
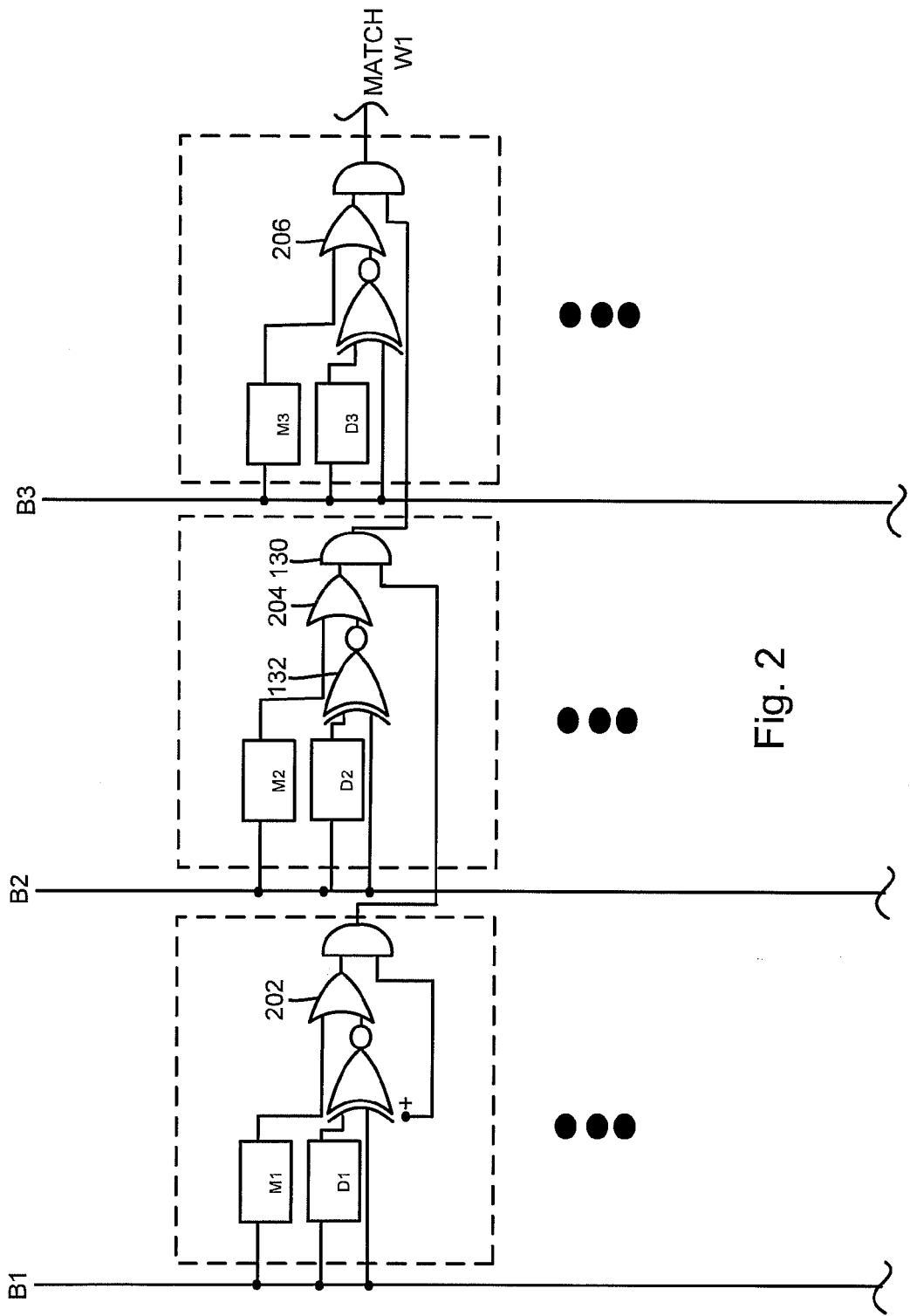
FIG. 2 shows a portion of an example prior art TCAM.

In the TCAM implementation of FIG. 7, for example, at least two additional XOR gates (740 and 750) are provided for each input bit (e.g., each of B1, B2, B3, etc.) of each word compare circuit in order to facilitate parity checking. Note that these XOR gates are in addition to the circuitry employed to perform the compare operation. An example of such compare circuitry is shown in FIG. 2 herein.

It is noted by the inventor herein that while these additional XOR gates, which exist in addition to the compare circuitry in the TCAM, permit simultaneous parallel parity checking during each compare cycle, these additional XOR gates contribute to a high gate count and may, in some cases, render the resulting TCAM size unduly large. It is realized by the inventor herein that there exists some duplication of circuitry between the compare circuitry and the parity checking circuitry associated with each input bit. The inventor further realizes that the high number of gate count is present to facilitate the simultaneous performance of both the parity checking function and the compare function in a given TCAM cycle (as in the case discussed in connection with FIG. 7). As the term is employed herein, the compare function refers to the operation that compares the input values on the input bit lines against the stored data values with possible masking using the stored mask values. The parity checking function refers to the operation that ensures that the values of the stored data bits and/or stored mask bits are not corrupted by checking the values of the combined bit pattern that includes the extra parity bit(s), the stored data bits and/or the stored mask bits for conformance with some parity policy. If one function instead of both (i.e., either the parity checking function or the compare function instead of both) is performed during any given TCAM cycle, some gates may be employed to perform either function in different TCAM cycles (e.g., shared by both functions but employed in different TCAM cycles), resulting in smaller, more efficient logic circuitry.

Figure 10:
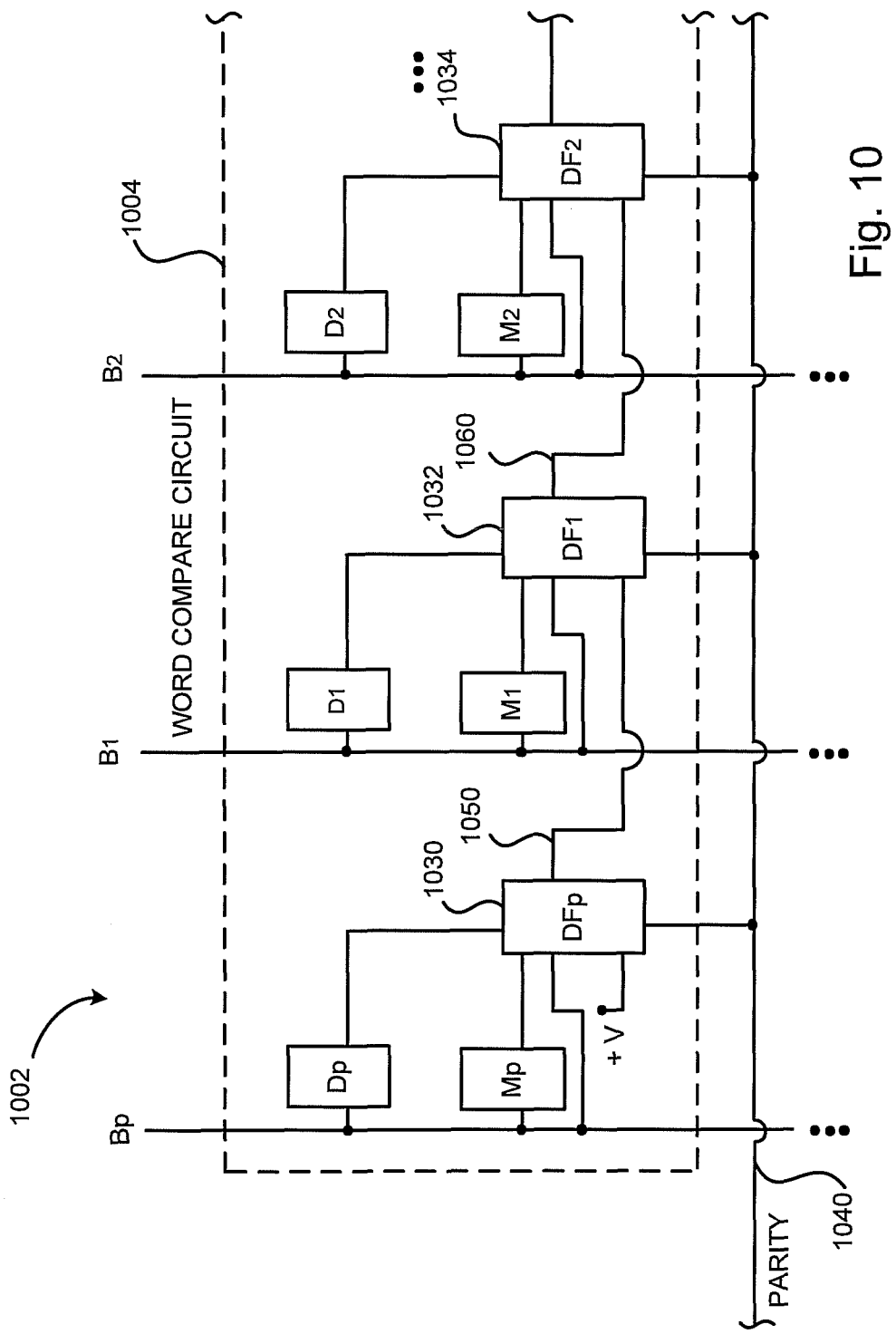
FIG. 10 shows, in accordance with an embodiment of the invention, a section of a word compare circuit of a TCAM that employs dual-function logic blocks to alternately perform the compare function or the parity checking function in different TCAM cycles.

FIG. 10 shows, in accordance with an embodiment of the invention, a section 1002 of a word compare circuit 1004 of a TCAM that employs dual-function logic blocks to alternately perform the compare function or the parity checking function in different TCAM cycles. In FIG. 10, there are shown two parity bit storage cells Dp and Mp to facilitate parity checking of the stored data bits and the stored mask bits respectively in accordance with some predefined parity checking policy (i.e., either positive parity or negative parity). These parity bit storage cells are written via a parity bit line Bp shown.

There are shown two input bit lines B1 and B2, representing some of the input bit lines that provide the value to be compared by word compare circuit 1004. Although a typical word compare circuit may employ many more input bit lines, those are not shown in FIG. 10 to avoid unnecessarily cluttering up the illustration.

Each input bit line is associated with a stored data bit and a mask bit, which are employed for comparison purposes. Thus, input bit line B1 is associated with stored data bit D1 and mask bit M1, while input bit line B2 is associated with stored data bit D2 and mask bit M2.

There are shown a plurality of dual function logic blocks 1030, 1032, and 1034 associated with bit lines Bp, B1, and B2. Each dual function logic block is configured to perform either the compare function or the parity checking function, depending on the state of select line "Parity" 1040. In an embodiment, if parity line 1040 is low, the dual function logic blocks act as compare circuits, and the outputs from the word compare circuits represent compare results. If parity line 1040 is low (i.e., the compare function is enabled), the output of dual function logic block DFp associated with the parity bit stage is a 1. If parity line 1040 is high, the dual function logic blocks act as parity checking circuits, and the outputs from the word compare circuits represent parity error signals. If parity line 1040 is high (i.e., the parity checking function is enabled), dual function logic block DFp associated with the parity bit stage outputs the appropriate parity information into the next stage. It should be noted at this point that the choice of polarity discussed above, as is the case throughout this disclosure, is arbitrary and may be reversed if desired for a particular implementation. Depending on the state of parity line 1040, an appropriate encoder may then be employed to detect the word compare circuit that outputs the first match or the word compare circuit that produces the first parity error (if a parity error exists).

Table 1 shows a logic table for the dual function logic block (e.g., 1032 or 1034) of FIG. 10. In Table 1, P represents the state of parity line 1040; M represents the value of the mask bit associated with the dual function logic block (e.g., M2 for DF2); D represents the value of the stored data bit associated with the dual function logic block (e.g., D2 for DF2); B represents the input bit value associated with the dual function logic block (e.g., B2 for DF2); and PB represents the previous bit value, i.e., the value output by the previous dual function logic block (e.g., the value output by DF1 for inputting into DF2). In Table 1, the notation fn represents the output of the dual function logic block, and the notation X represents the "don't care" condition.

TABLE 1

| Row # | P | M | D | B | PB | fn |
|---|---|---|---|---|---|---|
| 1 | 0 | X | X | X | 0 | 0 |
| 2 | 0 | 0 | 0 | 0 | 1 | 1 |
| 3 | 0 | 0 | 0 | 1 | 1 | 0 |
| 4 | 0 | 0 | 1 | 0 | 1 | 0 |
| 5 | 0 | 0 | 1 | 1 | 1 | 1 |
| 6 | 0 | 1 | X | X | 0 | 0 |
| 7 | 0 | 1 | X | X | 1 | 1 |
| 8 | 1 | 0 | 0 | X | 0 | 0 |
| 9 | 1 | 0 | 0 | X | 1 | 1 |
| 10 | 1 | 0 | 1 | X | 0 | 1 |
| 11 | 1 | 0 | 1 | X | 1 | 0 |
| 12 | 1 | 1 | 0 | X | 0 | 1 |
| 13 | 1 | 1 | 0 | X | 1 | 0 |
| 14 | 1 | 1 | 1 | X | 0 | 0 |
| 15 | 1 | 1 | 1 | X | 1 | 1 |

Although active-high logic is contemplated in the example of Table 1, active-low logic may also be implemented. The physical implementation of the dual function logic block from the logic table of Table 1 may vary. Various techniques, including computer-assisted circuit synthesizing techniques, exist for optimizing and creating logic circuitry for implementing the logic table of Table 1, and the invention is not limited to any particular technique or any particular physical implementation. For example, a Karnaugh map technique may be applied and the resultant logic equations may be employed to create logic gates. In general, the preference is for a dual function logic block that consumes little energy, is fast, small, easy to fabricate and/or inexpensive to make.

It is realized that when the parity checking function is enabled (e.g., when the parity line is driven high), the values at the input bit lines (e.g., B1, B2, etc.) are don't cares. In an embodiment, the input bit lines (e.g., B1, B2, etc.) may be driven low when the parity checking function is enabled (e.g., when the parity line is driven high) in order to further simplify the implementation of the dual function logic blocks. The same consideration applies to the implementation discussed later in connection with Tables 2 and 3 below.

In an embodiment, it is contemplated the TCAM size may be made smaller when there exists at least one logic gate in the dual function logic block that is shared in a mutually exclusive manner by both functions (i.e., the same shared logic gate is used by either the compare function or the parity checking function in different cycles). Techniques for creating logic circuitry from Table 1 to enable a given logic gate to be shared, in a mutually exclusive manner responsive to a selection signal, by two operations are known. The existence of the shared logic gate reflects an elimination of at least one duplicate logic gate that exists when both functions may be performed simultaneously in the same cycle. The existence of the mutually exclusively shared logic gate or mutually exclusively shared logic circuitry renders, in an embodiment, the dual function logic block capable of either the parity checking function or the compare function in the same cycle, but not both functions in the same TCAM cycle.

Figure 12:
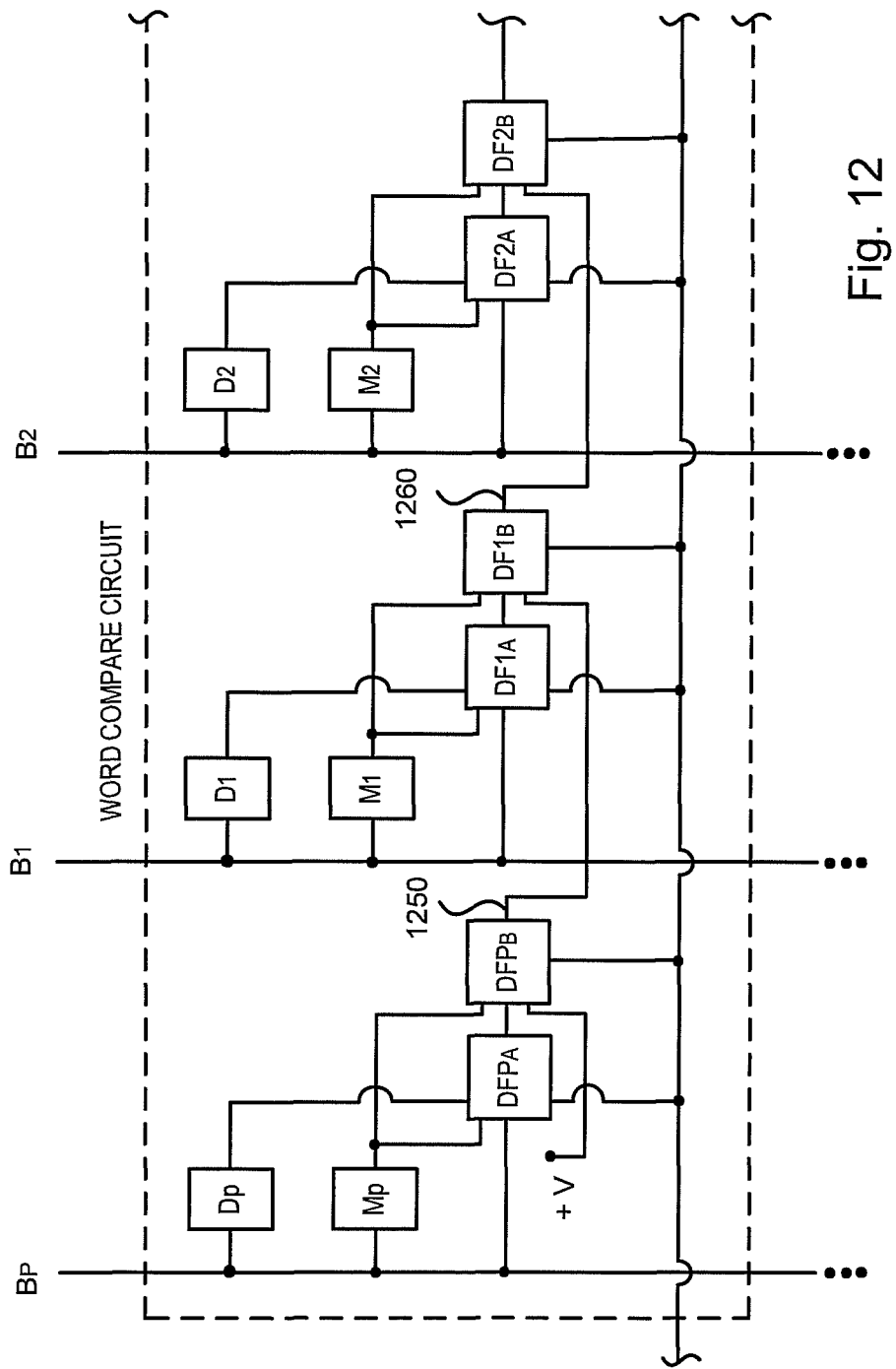
FIG. 12 shows, in accordance with an embodiment of the invention, an implementation wherein two dual function logic sub-blocks are provided with each input bit to perform the compare function or the parity checking function in different TCAM cycles.

Furthermore, in FIG. 10 and a subsequent FIG. 12 herein, note that a single line connects one stage to the next stage in each word compare circuit. For example, a single line 1050 in FIG. 10 (or 1250 in FIG. 12) connects the parity bit stage to the first bit line B1 stage in the word compare circuit shown. Likewise, a single line 1060 (or 1260 in FIG. 12) connects the first bit line stage B1 to the second bit line stage B2 in the word compare circuit shown. This single line (e.g., 1050, 1060, 1250, or 1260) carries either the match information or the parity information depending on the function being performed by the dual function logic block. The sharing of a single line (instead of using two lines) to carry the matching information and the parity information from stage to stage in each word compare circuit further improves the efficiency of the TCAM from both an electrical standpoint and a physical size standpoint.

Additionally, the output of each word compare circuit also employs a single line to convey either the match information or the parity information. This sharing again improves the efficiency of the resulting TCAM. The outputs from the word compare circuits of the TCAM may then be decoded using, in an embodiment, the same decoder to ascertain the word compare circuit that produces the first match (if the compare function is activated) or the word compare circuit that produces the first parity error (if the parity checking function is activated). The sharing of a single encoder circuit to perform either the compare result decoding function or the parity check result decoding function also improves the efficiency of the TCAM from both an electrical standpoint and a physical size standpoint.

Figure 11:
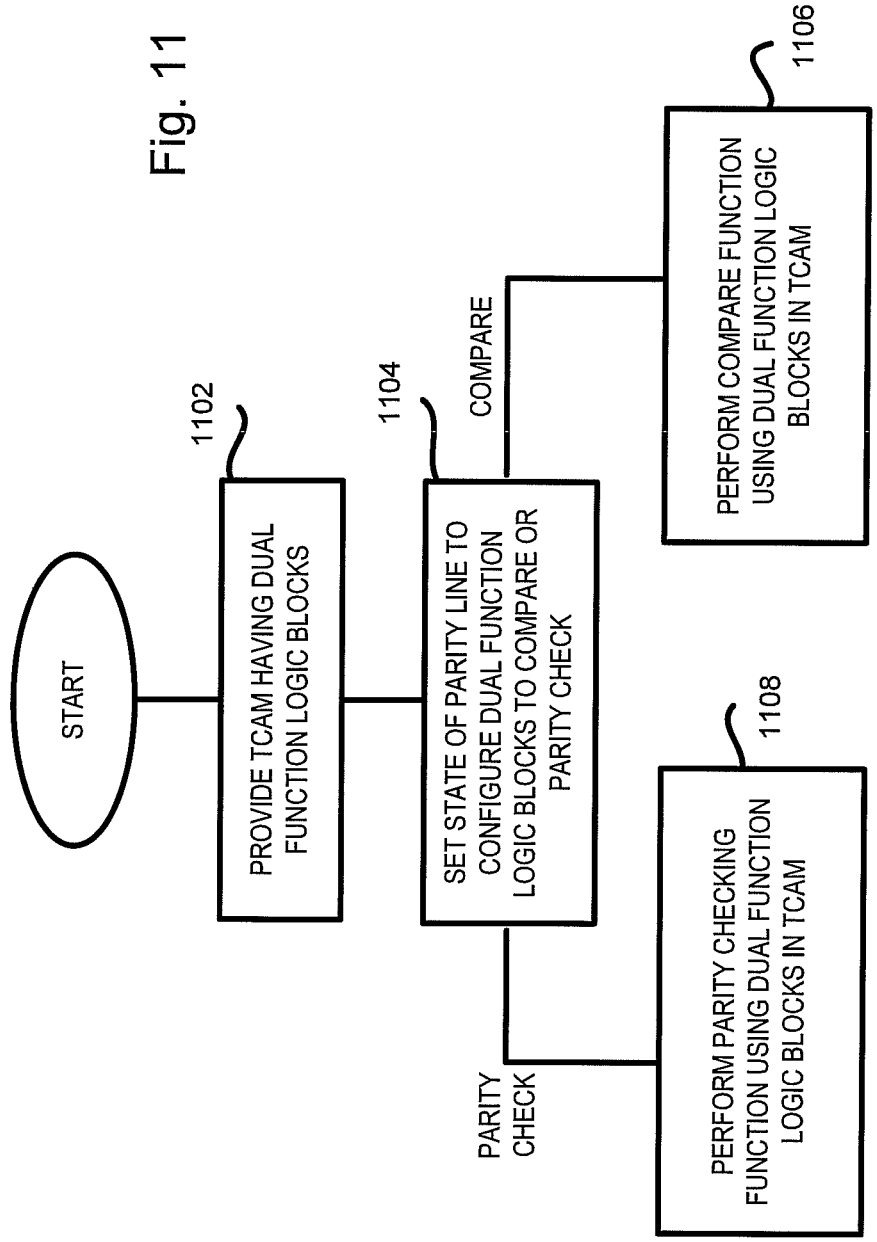
FIG. 11 shows, in accordance with an embodiment of the invention, a flowchart illustrating the operation of a TCAM having dual function logic blocks that alternately perform the compare function or the parity checking function in different TCAM cycles.

FIG. 11 shows, in accordance with an embodiment of the invention, a flowchart illustrating the operation of a TCAM having dual function logic blocks that alternately perform the compare function or the parity checking function in different TCAM cycles. In step 1102, a TCAM circuit having dual function logic blocks is provided. In step 1104, the state of the parity line is set in order to configure the dual function logic blocks within the TCAM to perform either the parity checking function or the compare function. In general, it is not necessary to perform the parity checking function and the compare function in a 1-to-1 ratio. In some cases, it may be advantageous to perform parity checking after N compare cycles, whereby N is an integer. Generally speaking, frequent parity checking gives a greater assurance of the robustness of the TCAM and a greater assurance that the compare result is correct. However, a parity checking regime that is unduly frequent suffers a higher overhead (in term of processing bandwidth) than a parity checking regime that only occasionally checks for parity problems.

In an implementation, the TCAM is employed for IP (Internet Protocol) address lookup, and an incoming packet may require multiple compare cycles. In this case, a parity checking cycle may be performed for each packet after the plurality of compare cycles performed to accomplish the IP packet address lookup are completed.

If the parity line is set to configure the dual function logic blocks in the TCAM to perform the compare function, the compare function is performed by the TCAM in step 1106. The word compare circuit outputs of the TCAM are employed as compare results. An appropriate encoder (not shown) may then be employed to ascertain the word compare circuit that produces the first match.

On the other hand, if the parity line is set to configure the dual function logic blocks in the TCAM to perform the parity checking function, the parity checking function is performed (1108) simultaneously on all word compare circuits of the TCAM by the dual function logic blocks therein. The word compare circuit outputs of the TCAM are employed as parity error signals. An appropriate encoder (e.g., the same encoder employed when the compare function is enabled) may then be employed to ascertain the word compare circuit that produces the first parity error, if such a parity error is found.

In another embodiment, the dual function logic block may be implemented by two separate dual function logic sub-blocks. For example, dual function logic block DF1 of FIG. 10 may be implemented by two sub-blocks DF1A and DF1B. Such implementation may be desirable in some cases (for example from a physical size standpoint and/or timing consideration standpoint).

FIG. 12 shows, in accordance with an embodiment of the invention, such an implementation wherein two dual function logic sub-blocks are provided with each input bit (B1, B2, etc.) to perform the compare function or the parity checking function in different TCAM cycles. FIG. 12 is substantially similar to FIG. 10 except that each of dual function logic block DFp, DF1, DF2, etc., has been replaced by two dual function logic sub-blocks. Thus dual function logic block DF1 of FIG. 10 is implemented by dual function logic sub-blocks DF1A and DF1B of FIG. 12, for example.

Note that dual function logic sub-block DF2A (i.e., the "A" series sub-block) receives as inputs the stored data bit (e.g., D2), the mask bit (e.g., M2), the input value (e.g., B2), and the parity selection line (e.g., either high or low to configure the A series sub-blocks to act as compare circuit sub-blocks or parity checking sub-blocks). Dual function logic sub-block DF2B (i.e., the "B" series sub-block) receives as inputs the output of its associated A-series sub-block (e.g., the output of the A-series sub-block DF2A is input into the B-series sub-block DF2B), the mask bit (e.g., M2), the output from the previous stage (e.g., the output from the B-series sub-block associated with input bit line B1, DF1B, is inputted into the B-series sub-block DF2B associated with input line B2), and the parity selection line (e.g., either high or low to configure the B series sub-blocks to act as compare circuit sub-blocks or parity checking sub-blocks).

Table 2 shows the logic table for the series A sub-blocks. In Table 2, P represents the state of parity line 1040; M represents the value of the mask bit associated with the series A sub-block (e.g., M2 for DF2A); D represents the value of the stored data bit associated with the series A sub-block (e.g., D2 for DF2A); and B represents the input bit value associated with the series A sub-block (e.g., B2 for DF2A). In Table 2, the notation fA represents the output of the series A sub-block, and the notation X represents the "don't care" condition. Although active-high logic is contemplated in the example of Table 2, active-low logic may also be implemented.

TABLE 2

| Row # | P | M | D | B | fA |
|---|---|---|---|---|---|
| 1 | 0 | X | 0 | 0 | 1 |
| 2 | 0 | X | 0 | 1 | 0 |
| 3 | 0 | X | 1 | 0 | 0 |
| 4 | 0 | X | 1 | 1 | 1 |
| 5 | 1 | 0 | 0 | X | 1 |
| 6 | 1 | 0 | 1 | X | 0 |
| 7 | 1 | 1 | 0 | X | 0 |
| 8 | 1 | 1 | 1 | X | 1 |

Table 3 shows the logic table for the series B sub-blocks. In Table 3, P represents the state of parity line 1040; M represents the value of the mask bit associated with the series B sub-block (e.g., M2 for DF2B); A_OUT represents the output of the associated A-series sub-block (e.g., the output of sub-block DF2A for series B sub-block DF2B); and PB represents the value of the output from the previous stage (e.g., the output from the B-series sub-block associated with input bit line B1). In Table 3, the notation fB represents the output of the series B sub-block, and the notation X represents the "don't care" condition. Although active-high logic is contemplated in the example of Table 3, active-low logic may also be implemented.

TABLE 3

| Row # | P | M | A_OUT | PB | fB |
|---|---|---|---|---|---|
| 1 | 0 | 0 | 0 | 0 | 0 |
| 2 | 0 | 0 | 0 | 1 | 0 |
| 3 | 0 | 0 | 1 | 0 | 0 |
| 4 | 0 | 0 | 1 | 1 | 1 |
| 5 | 0 | 1 | X | 0 | 0 |
| 6 | 0 | 1 | X | 1 | 1 |
| 7 | 1 | X | 0 | 0 | 1 |
| 8 | 1 | X | 0 | 1 | 0 |
| 9 | 1 | X | 1 | 0 | 0 |
| 10 | 1 | X | 1 | 1 | 1 |

Again, the physical implementations of these dual function logic sub-blocks from the logic tables of Table 2 and Table 3 may vary. Various techniques, including computer-assisted circuit synthesizing techniques, exist for optimizing and creating logic circuitry for implementing the logic tables of Tables 2 and 3, and the invention is not limited to any particular technique or any particular physical implementation. For example, a Karnaugh map technique may be applied and the resultant logic equations may be employed to create logic gates. In general, the preference (but not an absolute requirement) is for dual function logic sub-blocks that consume little energy, are fast, small, easy to fabricate and/or inexpensive to make.

In an embodiment, it is contemplated the TCAM size may be made smaller when there exists at least one logic gate in the dual function logic sub-block (e.g., DF1A and/or DF1B) that is shared in a mutually exclusive manner by both functions (i.e., the same shared logic gate is used by either the compare function or the parity checking function in different cycles). Techniques for creating logic circuitry from Table 2 and/or Table 3 to enable a given logic gate to be shared, in a mutually exclusive manner in different TCAM cycles responsive to a selection signal, by two operations are known. The existence of the shared logic gate reflects an elimination of at least one duplicate logic gate that exists when both functions may be performed simultaneously in the same cycle. The existence of the mutually exclusively shared logic gate or mutually exclusively shared logic circuitry renders, in an embodiment, the dual function logic sub-block capable of participating in either the parity checking function or in the compare function in the same cycle, but not both functions in the same TCAM cycle.

Figure 13:
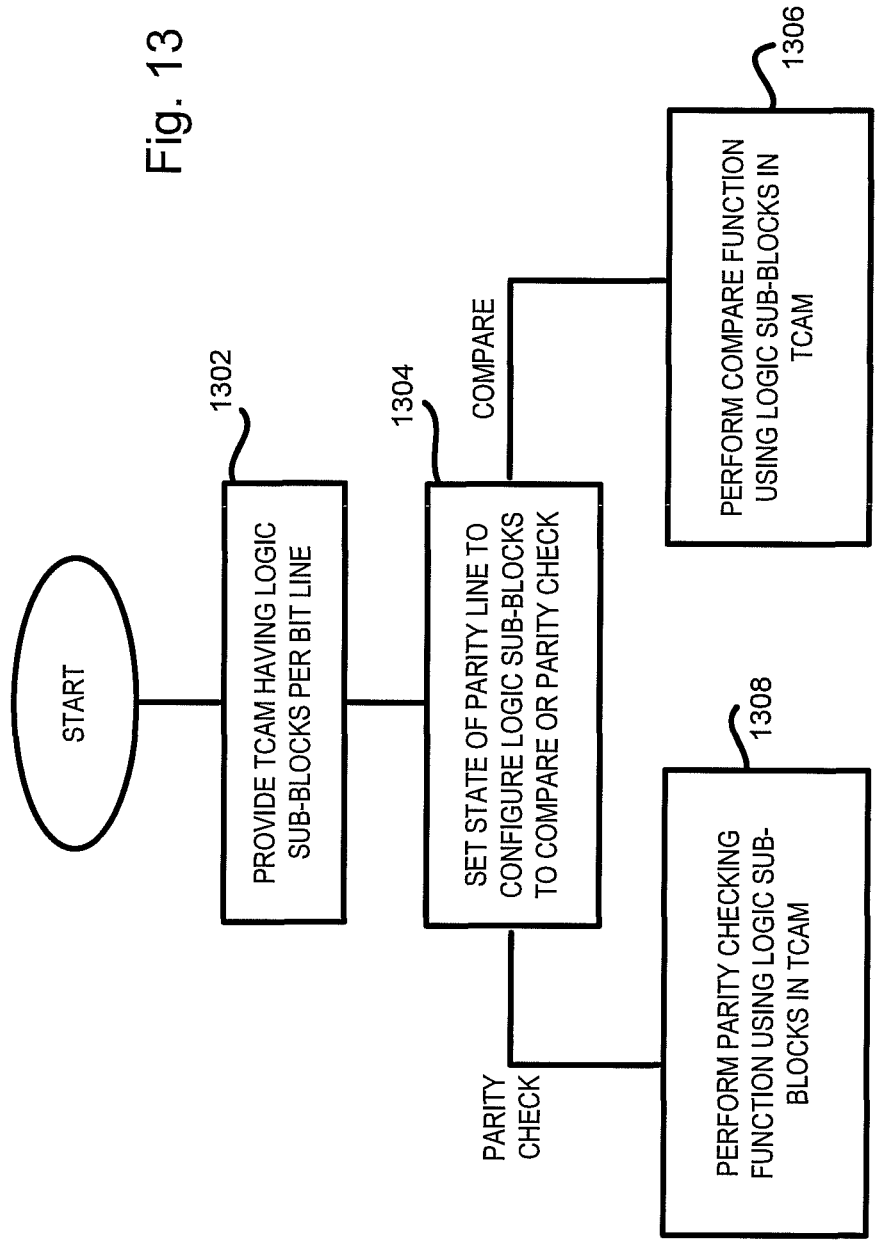
FIG. 13 shows, in accordance with an embodiment of the invention, a flowchart illustrating the operation of a TCAM having dual function logic sub-blocks that alternately perform the compare function or the parity checking function in different TCAM cycles.

FIG. 13 shows, in accordance with an embodiment of the invention, a flowchart illustrating the operation of a TCAM having dual function logic sub-blocks that alternately perform the compare function or the parity checking function in different TCAM cycles. In step 1302, a TCAM circuit having dual function logic sub-blocks for each bit line is provided. In step 1304, the state of the parity line is set in order to configure the dual function logic sub-blocks within the TCAM to perform either the parity checking function or the compare function.

If the parity line is set to configure the dual function logic sub-blocks in the TCAM to perform the compare function, the compare function is performed by the dual function logic sub-blocks of the TCAM in step 1306. The word compare circuit outputs of the TCAM are employed as compare results. An appropriate encoder (not shown) may then be employed to ascertain the word compare circuit that produces the first match.

On the other hand, if the parity line is set to configure the dual function logic sub-blocks in the TCAM to perform the parity checking function, the parity checking function is performed simultaneously on all word compare circuits of the TCAM by the dual function logic sub-blocks therein. The word compare circuit outputs of the TCAM are employed as parity error signals. An appropriate encoder (e.g., the same encoder employed when the compare function is enabled) may then be employed to ascertain the word compare circuit that produces the first parity error, if such a parity error is found.

Figure 14:
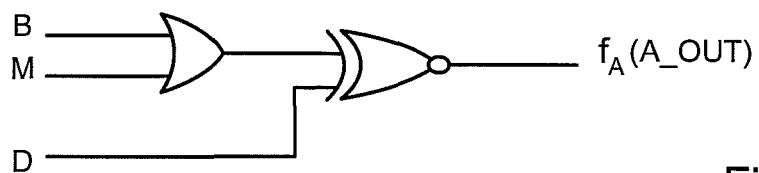
FIG. 14 shows, in accordance with an embodiment of the invention, an example optimized implementation of the A-series logic sub-block.

FIG. 14 shows, in accordance with an embodiment of the invention, an example implementation of the A-series logic sub-block (e.g., logic sub-block DF1A of FIG. 12) that is optimized by having the input bit line driven low when the parity line is high (reflecting the selection of the parity check function). In FIG. 14, the XOR gate is shared. Since XOR gates tend to be large gates, the sharing of the XOR gate in the A-series logic sub-block represents a significant efficiency improvement. The optimization is possible because when the parity line is high, the value of the input bit line is a "don't care." Further, if the mask value M is 1 and the compare function is enabled, the output value of the A-series logic block is not employed by the B-series sub-block during the compare operation.

Figure 15A:
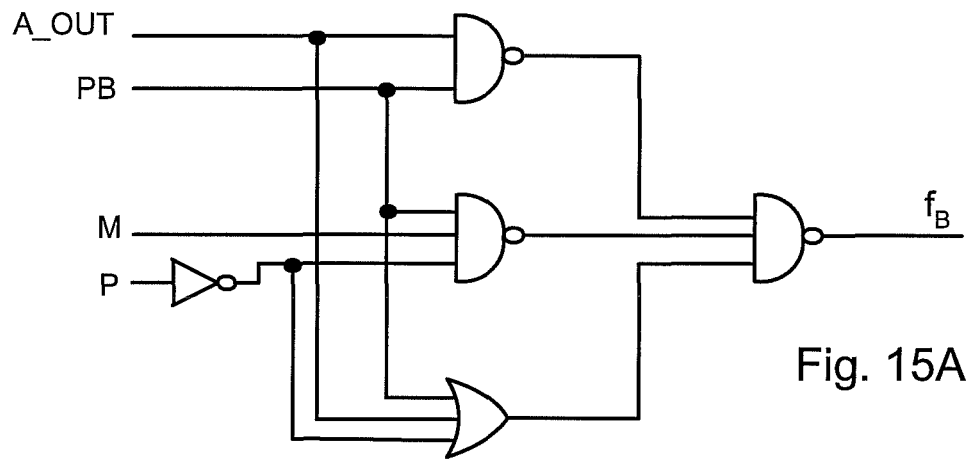
FIGS. 15A and 15B illustrate, in accordance with embodiments of the invention, two example optimized implementations of the B-series logic sub-block.
Figure 15B:
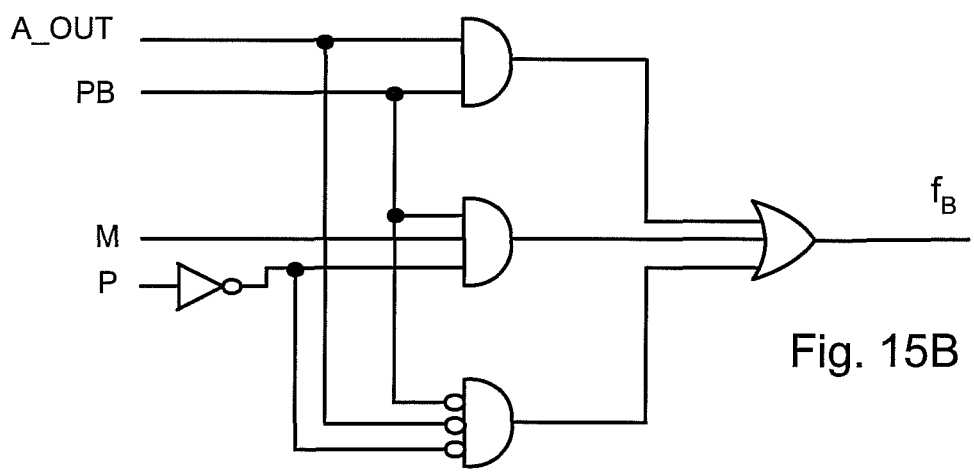

FIGS. 15A and 15B illustrate, in accordance with embodiments of the invention, two example optimized implementations of the B-series logic sub-block (e.g., logic sub-block DF1B of FIG. 12). In FIGS. 15A and 15B, note that the inverter for the parity line P may be eliminated if the inverted version of the signal P is employed. Although FIGS. 14, 15A, and 15B represent some advantageous example implementations, it should be said that optimization implementations in general depend on the optimization goal (e.g., whether speed is more important than physical dimension) as well as the technology that is employed to create the logic gates. Other implementations are possible to realize the logic disclosed herein.

As can be appreciated from the foregoing, these embodiments of the invention enable parity checking in TCAM cycles in which the compare function is not performed. Since the logic circuitry performs either the compare function or the parity checking function but not both in a given TCAM cycle, some logic circuit duplication may be eliminated, resulting in a smaller overall TCAM. Furthermore, during a TCAM cycle when parity checking is undertaken, the stored data bit patterns and the stored mask bit patterns in the word compare circuits are checked in parallel, thus substantially maintaining the parallel parity checking speed advantage.

While this invention has been described in terms of several preferred embodiments, there are alterations, permutations, and equivalents which fall within the scope of this invention. For example, although the parity check employs odd parity, even parity may also be employed. As another example, although the X-OR function is employed to perform the parity check, XNOR may also be employed. As yet another example, the global error detection signal may be generated by OR-ing (instead of AND-ing) together the local error detection signals from the various word compare circuits. It should also be noted that there are many alternative ways of implementing the apparatuses of the present invention. It is therefore intended that the following appended claims be interpreted as including all such alterations, permutations, and equivalents as fall within the true spirit and scope of the present invention.

The invention claimed is:

1. A method for remedying data corruption in a ternary content addressable memory (TCAM) integrated circuit (IC), said TCAM IC having a plurality of word compare circuits, each of said plurality of word compare circuits being configurable to perform either a compare function or a parity checking function during a given cycle of said TCAM IC, comprising:

selecting said TCAM IC to perform said one of said compare function and said parity checking function, said compare function and said parity checking function being performed by mutually exclusively shared dual function logic circuitry in said each of said plurality of word compare circuits that performs said compare function and said parity checking function in the alternative in any given cycle of said TCAM IC;

if said TCAM IC is selected to perform said compare function, processing outputs of said word compare circuits as TCAM match results; and if said TCAM IC is selected to perform said parity checking function, processing outputs of said word compare circuits as parity error signals.

2. The method of claim 1 wherein a given word compare circuit of said plurality of word compare circuits employs a single line to connect from a given bit line stage to an adjacent bit line stage that is adjacent to said given bit line stage, said single line carries either compare result information from said given bit line stage to said adjacent bit line stage when said TCAM IC is selected to perform said compare function or parity-related information from said given bit line stage to said adjacent bit line stage when said TCAM IC is selected to perform said parity checking function.

3. The method of claim 1 wherein said plurality of word compare circuits employ the same encoder for decoding the identity of a particular word compare circuit of said plurality of word compare circuits irrespective whether said TCAM IC is selected to perform said parity checking function or said compare function.

4. The method of claim 1 wherein said dual function logic circuitry includes at least one logic gate that is shared in a mutually exclusive manner by said compare function and parity checking function so as to render said dual function logic circuitry incapable of performing both said compare function and said parity checking function in any one cycle of said TCAM IC.

5. The method of claim 1 wherein said dual function logic circuitry includes shared logic that is shared in a mutually exclusive manner by said compare function and said parity checking function so as to render said dual function logic circuitry incapable of performing both said compare function and said parity checking function in any one cycle of said TCAM IC.

6. The method of claim 1 wherein said dual function logic circuitry in said each of said word compare circuits receives as inputs a stored data bit value, a stored mask bit value, an input bit value, a previous stage output value, and a selection signal that indicates whether said dual function logic circuitry performs said parity checking function or said compare function.

7. The method of claim 6 wherein said dual function logic circuitry is implemented by a dual function logic block.

8. The method of claim 6 wherein said dual function logic block implements the following logic table wherein X represents a "don't care" condition, P represents said selection signal, M represents said mask bit value, D represents said data bit value, B represents said input bit value, PB represents said previous stage output value, and fn represents an output of said dual function logic block

| P | M | D | B | PB | fn |
|---|---|---|---|----|----|
| 0 | X | X | X | 0  | 0  |
| 0 | 0 | 0 | 0 | 1  | 1  |
| 0 | 0 | 0 | 1 | 1  | 0  |
| 0 | 0 | 1 | 1 | 1  | 1  |
| 0 | 1 | X | X | 0  | 0  |
| 0 | 1 | X | X | 1  | 1  |
| 1 | 0 | 0 | X | 0  | 0  |
| 1 | 0 | 0 | X | 1  | 1  |
| 1 | 0 | 1 | X | 0  | 1  |
| 1 | 0 | 1 | X | 1  | 0  |
| 1 | 1 | 0 | X | 0  | 1  |
| 1 | 1 | 0 | X | 1  | 0  |
| 1 | 1 | 1 | X | 0  | 0  |
| 1 | 1 | 1 | X | 1  | 1  |

9. The method of claim 5 wherein said dual function logic circuitry is implemented by a first dual function logic sub-block and a second dual function logic sub-block.

10. The method of claim 9 wherein said first dual function logic sub-block implements the following logic table wherein X represents a "don't care" condition, P represents said selection signal, M represents said mask bit value, D represents said data bit value, B represents said input bit value, and fA represents an output of said first dual function logic sub-block

| P | M | D | B | fA |
|---|---|---|---|----|
| 0 | X | 0 | 0 | 1  |
| 0 | X | 0 | 1 | 0  |
| 0 | X | 1 | 0 | 0  |
| 0 | X | 1 | 1 | 1  |
| 1 | 0 | 0 | X | 1  |
| 1 | 0 | 1 | X | 0  |
| 1 | 1 | 0 | X | 0  |
| 1 | 1 | 1 | X | 1  |

11. The method of claim 10 wherein said second dual function logic sub-block implements the following logic table wherein X represents a "don't care" condition, P represents said selection signal, M represents said mask bit value, A_OUT represents said output of said first dual function logic sub-block that is associated with the same input bit line as said second dual function logic sub-block, and fB represents an output of said second dual function logic sub-block

| P | M | A_OUT | PB | fB |
|---|---|-------|----|----|
| 0 | 0 | 0     | 0  | 0  |
| 0 | 0 | 0     | 1  | 0  |
| 0 | 0 | 1     | 0  | 0  |
| 0 | 0 | 1     | 1  | 1  |
| 0 | 1 | X     | 0  | 0  |
| 0 | 1 | X     | 1  | 1  |
| 1 | X | 0     | 0  | 1  |
| 1 | X | 0     | 1  | 0  |
| 1 | X | 1     | 0  | 0  |
| 1 | X | 1     | 1  | 1  |

12. The method of claim 1 wherein said parity checking function implements odd parity.

13. The method of claim 1 wherein said parity checking function implements even parity.

14. A method for remedying data corruption in a ternary content addressable memory (TCAM) integrated circuit (IC), said TCAM IC having a plurality of word compare circuits, each of said plurality of word compare circuits being configurable to perform either a compare function or a parity checking function during a given cycle of said TCAM IC, comprising:
   providing said TCAM IC having at least mutually exclusively shared dual function logic circuitry in said each of said plurality of word compare circuits, said mutually exclusively shared dual function logic circuitry includes shared logic that is shared in a mutually exclusive manner by said compare function and said parity checking function so as to render said dual function logic circuitry incapable of performing both said compare function and said parity checking function in any one cycle of said TCAM IC;
   selecting said TCAM IC to enable said TCAM IC to perform said one of said compare function and said parity checking function;
   if said TCAM IC is selected to perform said compare function, processing outputs of said word compare circuits as TCAM match results; and
   if said TCAM IC is selected to perform said parity checking function, processing outputs of said word compare circuits as parity error signals.

15. The method of claim 14 wherein a given word compare circuit of said plurality of word compare circuits employs a single line to connect from a given bit line stage to an adjacent bit line stage that is adjacent to said given bit line stage, said single line carries either compare result information from said given bit line stage to said adjacent bit line stage when said TCAM IC is selected to perform said compare function or parity-related information from said given bit line stage to said adjacent bit line stage when said TCAM IC is selected to perform said parity checking function.

16. The method of claim 14 wherein said plurality of word compare circuits employ the same encoder for decoding the identity of a particular word compare circuit of said plurality of word compare circuits irrespective whether said TCAM IC is selected to perform said parity checking function or said compare function.

17. The method of claim 14 wherein said dual function logic circuitry in said each of said word compare circuits receives as inputs a stored data bit value, a stored mask bit value, an input bit value, a previous stage output value, and a selection signal that indicates whether said dual function logic circuitry performs said parity checking function or said compare function.

18. The method of claim 17 wherein said dual function logic circuitry is implemented by a dual function logic block.

19. The method of claim 18 wherein said dual function logic block implements the following logic table wherein X represents a "don't care" condition, P represents said selection signal, M represents said mask bit value, D represents said data bit value, B represents said input bit value, PB represents said previous stage output value, and fn represents an output of said dual function logic block

| P | M | D | B | PB | fn |
|---|---|---|---|----|----|
| 0 | X | X | X | 0  | 0  |
| 0 | 0 | 0 | 0 | 1  | 1  |
| 0 | 0 | 0 | 1 | 1  | 0  |
| 0 | 0 | 1 | 0 | 1  | 0  |
| 0 | 0 | 1 | 1 | 1  | 1  |
| 0 | 1 | X | X | 0  | 0  |
| 0 | 1 | X | X | 1  | 1  |
| 1 | 0 | 0 | X | 0  | 0  |
| 1 | 0 | 0 | X | 1  | 1  |
| 1 | 0 | 1 | X | 0  | 1  |
| 1 | 0 | 1 | X | 1  | 0  |
| 1 | 1 | 0 | X | 0  | 1  |
| 1 | 1 | 0 | X | 1  | 0  |
| 1 | 1 | 1 | X | 0  | 0  |
| 1 | 1 | 1 | X | 1  | 1  |

20. The method of claim 14 wherein said dual function logic circuitry is implemented by a first dual function logic sub-block and a second dual function logic sub-block.

21. The method of claim 20 wherein said first dual function logic sub-block implements the following logic table wherein X represents a "don't care" condition, P represents said selection signal, M represents said mask bit value, D represents said data bit value, B represents said input bit value, and fA represents an output of said first dual function logic sub-block

| P | M | D | B | fA |
|---|---|---|---|----|
| 0 | X | 0 | 0 | 1  |
| 0 | X | 0 | 1 | 0  |
| 0 | X | 1 | 0 | 0  |
| 0 | X | 1 | 1 | 1  |
| 1 | 0 | 0 | X | 1  |
| 1 | 0 | 1 | X | 0  |
| 1 | 1 | 0 | X | 0  |
| 1 | 1 | 1 | X | 1  |

22. The method of claim 21 wherein said second dual function logic sub-block implements the following logic table wherein X represents a "don't care" condition, P represents said selection signal, M represents said mask bit value, A_OUT represents said output of said first dual function logic sub-block that is associated with the same input bit line as said second dual function logic sub-block, and fB represents an output of said second dual function logic sub-block

| P | M | A_OUT | PB | fB |
|---|---|-------|----|----|
| 0 | 0 | 0     | 0  | 0  |
| 0 | 0 | 0     | 1  | 0  |
| 0 | 0 | 1     | 0  | 0  |
| 0 | 0 | 1     | 1  | 1  |
| 0 | 1 | X     | 0  | 0  |
| 0 | 1 | X     | 1  | 1  |
| 1 | X | 0     | 0  | 1  |
| 1 | X | 0     | 1  | 0  |
| 1 | X | 1     | 0  | 0  |
| 1 | X | 1     | 1  | 1  |

* * * * *